(12) United States Patent
Komai

(10) Patent No.: US 11,705,468 B2
(45) Date of Patent: Jul. 18, 2023

(54) IMAGE-CAPTURING DEVICE AND IMAGE SENSOR

(71) Applicant: NIKON CORPORATION, Tokyo (JP)

(72) Inventor: Atsushi Komai, Tokorozawa (JP)

(73) Assignee: NIKON CORPORATION, Tokyo (JP)

( * ) Notice: Subject to any disclaimer, the term of this patent is extended or adjusted under 35 U.S.C. 154(b) by 705 days.

(21) Appl. No.: 16/333,623

(22) PCT Filed: Sep. 29, 2017

(86) PCT No.: PCT/JP2017/035755
§ 371 (c)(1),
(2) Date: Jun. 5, 2019

(87) PCT Pub. No.: WO2018/062560
PCT Pub. Date: Apr. 5, 2018

(65) Prior Publication Data
US 2020/0105818 A1    Apr. 2, 2020

(30) Foreign Application Priority Data
Sep. 30, 2016  (JP) ................................. 2016-194627

(51) Int. Cl.
*H01L 27/14*     (2006.01)
*H01L 27/146*    (2006.01)

(52) U.S. Cl.
CPC .. *H01L 27/14623* (2013.01); *H01L 27/14621* (2013.01); *H01L 27/14645* (2013.01); *H01L 27/14609* (2013.01)

(58) Field of Classification Search
CPC ............... H01L 27/14621; H01L 27/14645
See application file for complete search history.

(56) References Cited

U.S. PATENT DOCUMENTS

2002/0012064 A1   1/2002  Yamaguchi
2011/0069210 A1   3/2011  Ogura et al.
(Continued)

FOREIGN PATENT DOCUMENTS

CN    104243863 A    12/2014
JP    2001-333329 A  11/2001
(Continued)

OTHER PUBLICATIONS

Dec. 12, 2017 International Search Report issued in International Patent Application No. PCT/JP2017/035755.
(Continued)

*Primary Examiner* — Trang Q Tran
(74) *Attorney, Agent, or Firm* — Oliff PLC

(57) ABSTRACT

Image-capturing device includes: an image sensor that includes a first pixel and a second pixel, each having a filter unit that can be switched to a light-shielding state in which light is blocked or to a transmissive state in which light is transmitted, a photoelectric conversion unit that generates an electric charge through photoelectric conversion of light transmitted through the filter unit and an output unit that outputs a signal based upon electric charge generated at the photoelectric conversion unit, and; a correction unit that corrects a signal output from the output unit of the first pixel while the filter unit of the first pixel is in a transmissive state, based upon a signal output from the output unit of the first pixel with the filter unit of the first pixel set in a light-shielding state and with the filter unit of the second pixel set in a transmissive state.

12 Claims, 12 Drawing Sheets

(56) References Cited

U.S. PATENT DOCUMENTS

2014/0285627 A1* 9/2014 Kuboi .................... H04N 5/357
　　　　　　　　　　　　　　　　　　　　　　348/241
2014/0362241 A1　12/2014 Shimada

FOREIGN PATENT DOCUMENTS

| | | |
|---|---|---|
| JP | 2002-320236 A | 10/2002 |
| JP | 2009-016432 A | 1/2009 |
| JP | 2011-066800 A | 3/2011 |
| JP | 2011-066801 A | 3/2011 |
| JP | 2013-118573 A | 6/2013 |
| JP | 2014-165785 A | 9/2014 |
| JP | 2014-183206 A | 9/2014 |

OTHER PUBLICATIONS

Sep. 29, 2020 Office Action issued in Chinese Patent Application No. 201780068660.5.

Aug. 31, 2021 Office Action issued in Japanese Patent Application No. 2018-542060.

Feb. 8, 2022 Office Action issued in Japanese Patent Application No. 2018-542060.

* cited by examiner

IMAGE-CAPTURING DEVICE AND IMAGE SENSOR

TECHNICAL FIELD

The present invention relates to an image-capturing device and an image sensor.

BACKGROUND ART

There is an image-capturing device known that calculates a parameter used to correct color mixing at a regular pixel based upon a signal from a pixel, all the pixels adjacent to which are light-shielded pixels (see PTL 1). However, there is an issue with this image-capturing device in that an image signal cannot be obtained at a position taken by a light-shielded pixel.

CITATION LIST

Patent Literature

PTL 1: Japanese Laid Open Patent Publication No. 2011-66801

SUMMARY OF INVENTION

According to the 1st aspect of the present invention, an image-capturing device comprises: an image sensor that includes a first pixel and a second pixel, each having a filter unit that can be switched to a light-shielding state in which light is blocked or to a transmissive state in which light is transmitted, a photoelectric conversion unit that generates an electric charge through photoelectric conversion of light transmitted through the filter unit and an output unit that outputs a signal based upon the electric charge generated at the photoelectric conversion unit, and; a correction unit that corrects a signal output from the output unit of the first pixel while the filter unit of the first pixel is in a transmissive state, based upon a signal output from the output unit of the first pixel with the filter unit of the first pixel set in a light-shielding state and with the filter unit of the second pixel set in a transmissive state.

According to the 2nd aspect of the present invention, an image-capturing device comprises: an image sensor that includes a first pixel and a second pixel, each having a filter unit that can be switched to a light-shielding state in which light is blocked or to a transmissive state in which light is transmitted, a photoelectric conversion unit that generates an electric charge through photoelectric conversion of light transmitted through the filter unit and an output unit that outputs a signal based upon the electric charge generated at the photoelectric conversion unit, and; a correction unit that corrects a signal output from the output unit of the second pixel, based upon a signal output from the output unit of the first pixel while the filter unit of the first pixel is in a light-shielding state and the filter unit of the second pixel is in a transmissive state.

According to the 3rd aspect of the present invention, an image-capturing device comprises: an image sensor that includes a plurality of pixels, each having a filter unit that can be switched to a light-shielding state in which light is blocked or to a transmissive state in which light is transmitted, a photoelectric conversion unit that generates an electric charge through photoelectric conversion of light transmitted through the filter unit and an output unit that outputs a signal based upon the electric charge generated at the photoelectric conversion unit, and; a control unit that controls a position of an area that contains a pixel, the filter unit of which is in the light-shielding state, among the plurality of pixels.

According to the 4th aspect of the present invention, an image sensor comprises: a first pixel and a second pixel each having a filter unit that can be switched to a light-shielding state in which light is blocked or to a transmissive state in which light is transmitted, a photoelectric conversion unit that generates an electric charge through photoelectric conversion of light transmitted through the filter unit and an output unit that outputs a signal based upon the electric charge generated at the photoelectric conversion unit, and; a correction unit that corrects a signal output from the output unit of the first pixel while the filter unit of the first pixel is in a transmissive state based upon a signal output from the output unit of the first pixel with the filter unit of the first pixel set in a light-shielding state and with the filter unit of the second pixel set in a transmissive state.

According to the 5th aspect of the present invention, an image sensor comprises: a first pixel and a second pixel, each having a filter unit that can be switched to a light-shielding state in which light is blocked or to a transmissive state in which light is transmitted, a photoelectric conversion unit that generates an electric charge through photoelectric conversion of light transmitted through the filter unit and an output unit that outputs a signal based upon the electric charge generated at the photoelectric conversion unit, and; a correction unit that corrects a signal output from the output unit of the second pixel, based upon a signal output from the output unit of the first pixel while the filter unit of the first pixel is in a light-shielding state and the filter unit of the second pixel is in a transmissive state.

According to the 6th aspect of the present invention, an image sensor comprises: a plurality of pixels, each having a filter unit that can be switched to a light-shielding state in which light is blocked or to a transmissive state in which light is transmitted, a photoelectric conversion unit that generates an electric charge through photoelectric conversion of light transmitted through the filter unit and an output unit that outputs a signal based upon the electric charge generated at the photoelectric conversion unit, and; a control unit that controls a position of an area that contains a pixel, the filter unit of which is in a light-shielding state, among the plurality of pixels.

BRIEF DESCRIPTION OF DRAWINGS

FIG. 12 A diagram presenting an example of a state that may be assumed with respect to the filter units at the image sensor in variation 4

DESCRIPTION OF EMBODIMENTS

First Embodiment

Figure 1:
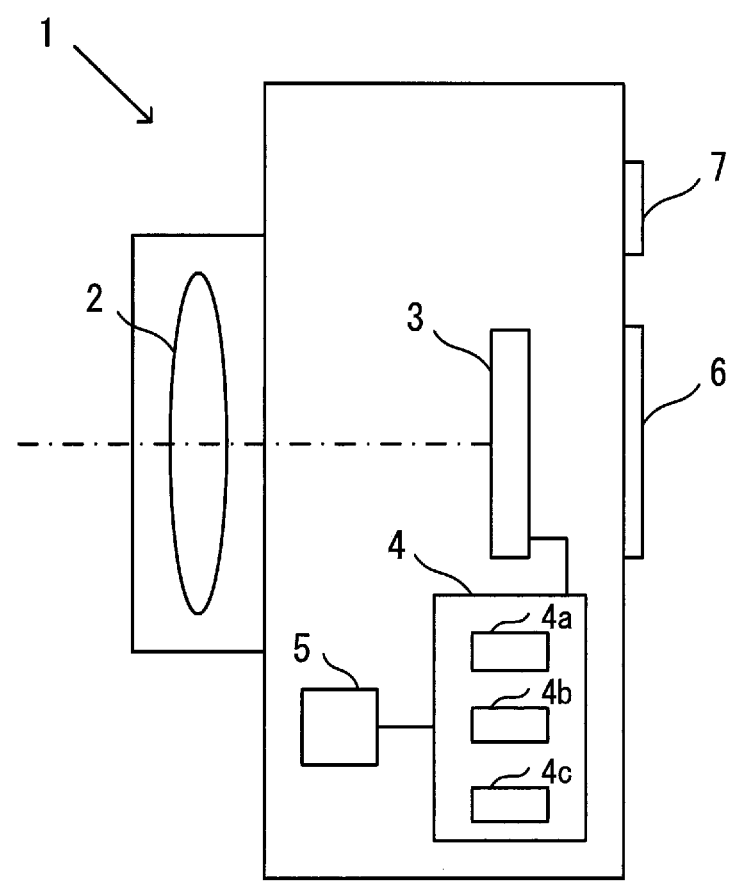
FIG. 1 A block diagram showing the structure of the image-capturing device achieved in a first embodiment FIG. 2 A block diagram showing the structure of part of the image sensor in the first embodiment FIG. 3 Diagrams in reference to which the structure of the image sensor achieved in the first embodiment will be explained FIG. 4 A circuit diagram showing the structure adopted in a pixel in the image sensor in the first embodiment FIG. 5 A diagram presenting an example of a state that may be assumed with respect to the filter units at the image sensor in the first embodiment FIG. 6 A diagram presenting another example of a state that may be assumed with respect to the filter units at the image sensor in the first embodiment FIG. 7 A flowchart of an example of an operation that may be executed in the image-capturing device in the first embodiment FIG. 8 A flowchart of an example of an operation that may be executed in the image-capturing device in a second embodiment FIG. 9 A diagram presenting an example of a state that may be assumed with respect to the filter units at the image sensor in the second embodiment FIG. 10 A diagram presenting an example of a state that may be assumed with respect to the filter units at the image sensor in variation 2

FIG. 1 is a block diagram showing the structure of the image-capturing device achieved in the first embodiment. The image-capturing device in the first embodiment may be an electronic camera 1 (hereafter will be referred to as a camera 1) adopting a structure such as that shown in FIG. 1. The camera 1 includes an image-capturing optical system (image forming optical system) 2, an image sensor 3, a control unit 4, a memory 5, a display unit 6 and an operation unit 7. The photographic optical system 2, which includes a plurality of lenses and an aperture, forms a subject image at the image sensor 3. It is to be noted that the photographic optical system 2 may be a detachable system that can be mounted at and dismounted from the camera 1.

The image sensor 3 may be, for instance, a CMOS image sensor or a CCD image sensor. The image sensor 3 captures the subject image formed via the photographic optical system 2. A plurality of pixels, each having a photoelectric conversion unit, are disposed at the image sensor 3. The photoelectric conversion unit may be constituted with, for instance, a photodiode (PD). The image sensor 3 generates a signal corresponding to the amount of light received therein and outputs the signal thus generated to the control unit 4.

The memory 5 may be, for instance, a recording medium such as a memory card. Image data and the like are recorded into the memory 5. Data are written into and read out from the memory 5 by the control unit 4. At the display unit 6, an image based upon image data is displayed, as well as photographic information indicating the shutter speed, the aperture value, etc., a menu screen and the like. The operation unit 7, which includes a shutter release button, various types of setting switches and the like, outputs an operation signal corresponding to a given operation to the control unit 4.

The control unit 4, configured with a CPU, a ROM, a RAM and the like, controls various components of the camera 1 based upon a control program. In addition, the control unit 4 includes a correction unit 4a, a storage unit 4b and an image generation unit 4c. The correction unit 4a calculates a dark current component and a color mixing correction coefficient based upon pixel signals output from individual pixels at the image sensor 3, as will be explained in detail later. In addition, the correction unit 4a executes correction processing so as to correct a pixel signal output from each of the pixels at the image sensor 3 based upon the dark current component and the color mixing correction coefficient. Dark current component values and color mixing correction coefficients calculated by the correction unit 4a are stored into the storage unit 4b. The processing executed by the correction unit 4a will be described in detail later.

The image generation unit 4c generates image data by executing various types of image processing on pixel signals having been corrected by the correction unit 4a. The various types of image processing include image processing of the known art such as gradation conversion processing, interpolation processing and edge enhancement processing.

Figure 2:
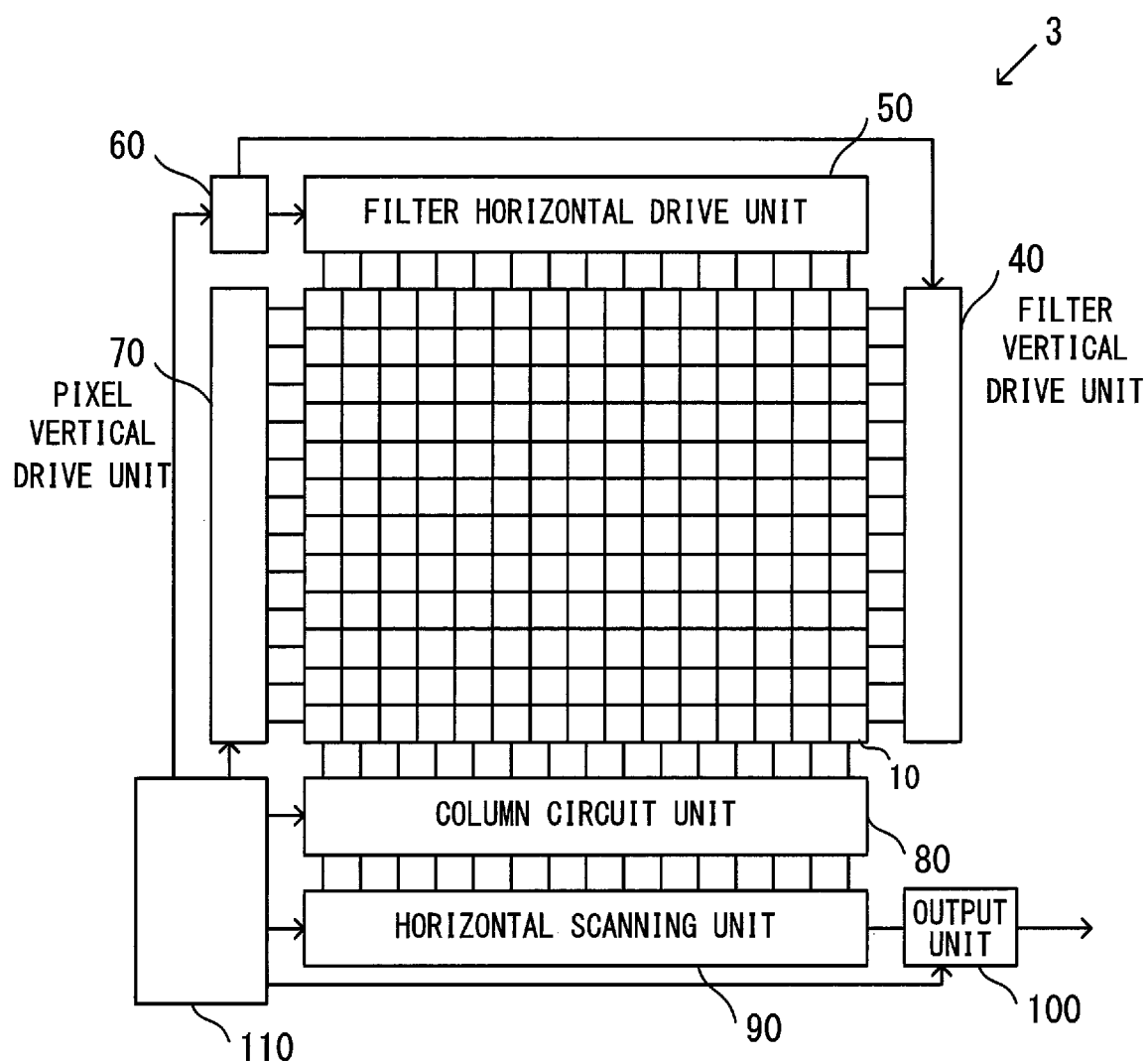
Figure 3:
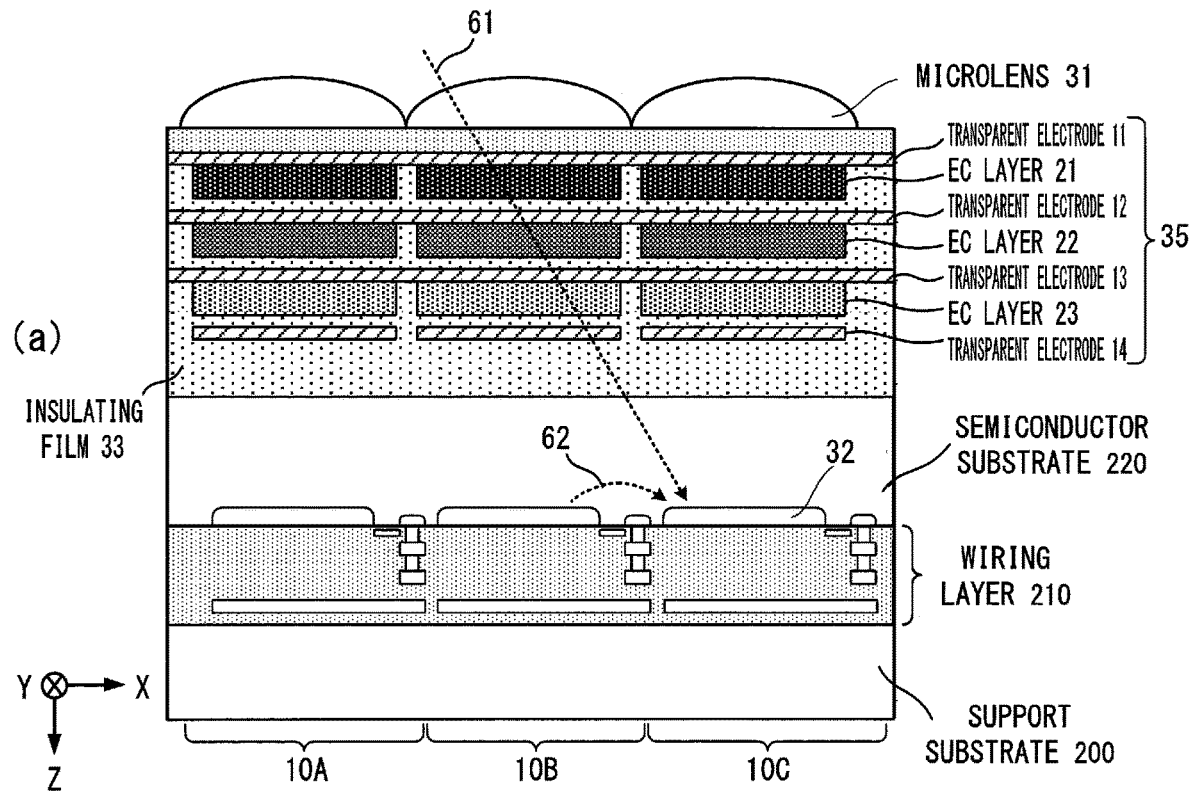
Figure 3:
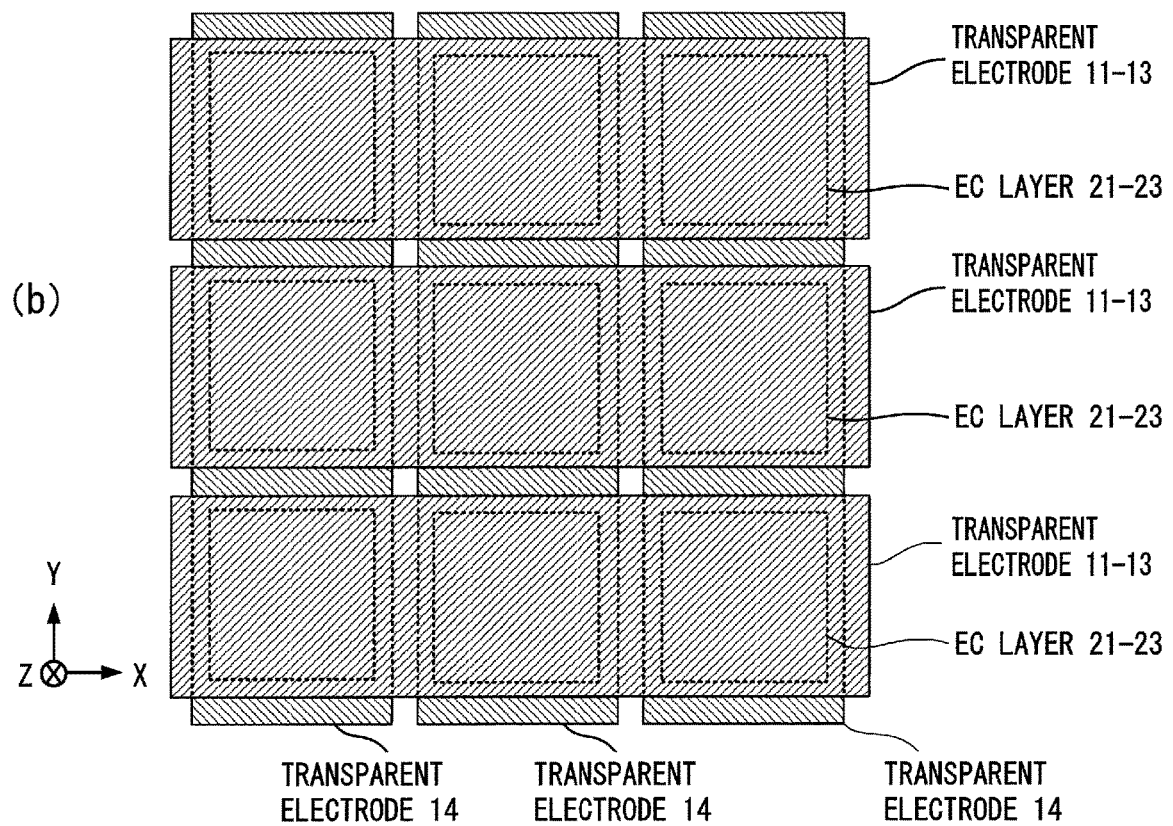

In reference to FIG. 2 and FIG. 3, the structure of the image sensor achieved in the first embodiment will be explained. FIG. 2 is a block diagram showing the structure of part of the image sensor 3 achieved in the first embodiment. FIG. 3 presents diagrams illustrating the structure of the image sensor 3 in the first embodiment. FIG. 3(*a*) presents an example of a structure that may be adopted in the image sensor 3 in a sectional view, whereas FIG. 3(*b*) illustrates how transparent electrodes may be laid out in the filter units at the image sensor 3 in a plan view.

As shown in FIG. 2, the image sensor 3 includes a plurality of pixels 10, a filter vertical drive unit 40, a filter horizontal drive unit 50, a filter control unit 60, a pixel vertical drive unit 70, a column circuit unit 80, a horizontal scanning unit 90, an output unit 100 and a system control unit 110. At the image sensor 3, the pixels 10 are disposed in a two-dimensional pattern (e.g., along a row direction, in which rows extend, and a column direction, in which columns extend). While only 15 pixels (across)×12 pixels (down) are shown as the pixels 10 so as to simplify the illustration in the example presented in FIG. 2, the image sensor 3 actually includes, for instance, several million to several hundred million pixels, or an even greater number of pixels.

As shown in FIG. 3(*a*), the image sensor 3 includes a semiconductor substrate 220, a wiring layer 210, a support substrate 200, microlenses 31 and filter units 35. The image sensor 3 in the example presented in FIG. 3(*a*) is configured as a back-illuminated image sensor. The semiconductor substrate 220 is laminated onto the support substrate 200 via the wiring layer 210. The semiconductor substrate 220 is constituted with, for instance, a silicon semiconductor substrate, whereas the support substrate 200 is constituted with a semiconductor substrate, a glass substrate or the like. In the wiring layer 210, which includes a conductor film (metal film) and an insulating film, a plurality of wirings, vias and the like are disposed. The conductor film may be constituted of, for instance, copper or aluminum. The insulating film may be an oxide film or a nitride film. Light, having passed through the photographic optical system 2, enters the image sensor as it advances primarily toward the + side along a Z axis. As the coordinate axes in the figure indicate, the direction running rightward on the drawing sheet perpendicular to the Z axis is designated as an X axis + direction and the direction running away from the viewer of the drawing, perpendicular to the Z axis and the X axis, is designated as a Y axis + direction.

The pixels 10 (pixels 10A through 10C in FIG. 3) each include a microlens 31, a filter unit 35 and a photoelectric conversion unit 32. The microlens 31 condenses light having entered therein onto the photoelectric conversion unit 32. The photoelectric conversion unit 32 generates an electric charge through photoelectric conversion of light having entered therein.

The filter unit 35 includes electro-chromic (hereafter will be referred to as EC) layers 21, 22 and 23 and transparent electrodes 11, 12, 13 and 14, laminated in sequence, starting on the side where the microlens 31 is present toward the semiconductor substrate 220. The EC layers 21 through 23 are formed by using an electro-chromic material such as a metal oxide. The transparent electrodes 11 through 14 may be constituted of, for instance, ITO (indium tin oxide). An insulating film 33 is disposed in the areas between the EC layer 21 and the transparent electrode 12, between the EC layer 22 and the transparent electrode 13, and between the EC layer 23 and the transparent electrode 14. In addition, an electrolytic layer (electrolytic film) (not shown) is disposed in the filter unit 35.

Transparent electrodes 11 are disposed, each in correspondence to a plurality of EC layers 21 that are disposed one after another along the X direction designated as a first direction, i.e., the row direction, so as to cover the surfaces of the plurality of EC layers 21 located on one side, as is clearly shown in FIG. 3(*b*). In the example presented in FIG. 2, the pixels 10 are arrayed in twelve rows and thus, twelve transparent electrodes 11 are disposed parallel to one another. Transparent electrodes 12 and transparent electrodes 13 are also disposed in much the same way as the transparent electrodes 11, so as to respectively cover the surfaces of the plurality of EC layers 22 and the surfaces of the plurality of EC layers 23 disposed one after another along the X direction on one side thereof.

A transparent electrode 14, which is a common electrode used in conjunction with three EC layers 21, 22 and 23, is disposed on the side where the other surface of the EC layer 23 is located. Common transparent electrodes 14 are disposed, each in correspondence to a plurality of sets of EC layers 23 that are disposed one after another to extend along the Y direction designated as a second direction that intersects the X direction, i.e., the column direction, along the plurality of EC layers 23, disposed one after another along the column direction as is clearly shown in FIG. 3(*b*). In the example presented in FIG. 2, the pixels 10 are arrayed over 15 columns, and thus, 15 common transparent electrodes 14 are disposed parallel to one another.

The transparent electrodes 11 through 13 and the common transparent electrodes 14 are electrodes disposed in a matrix pattern (mesh pattern) in relation to the EC layers 21, 22 and 23. The transparent electrodes 11 through 13 are connected to the filter vertical drive unit 40, whereas the common transparent electrodes 14 are connected to the filter horizontal drive unit 50. Thus, active matrix drive that enables drive control for the EC layers 21, 22 and 23 can be executed by using the electrodes disposed in the matrix pattern in the embodiment.

An EC layer 21 produces B (blue) color through an oxidation-reduction reaction induced as a drive signal is provided via the corresponding transparent electrode 11 and common transparent electrode 14. This means that light in a wavelength range corresponding to B (blue) in the incident light is transmitted through the EC layer 21 as a drive signal is provided thereto. An EC layer 22 produces G (green) color through an oxidation-reduction reaction induced as a drive signal is provided via the corresponding transparent electrode 12 and common transparent electrode 14. This means that light in a wavelength range corresponding to G (green) in the incident light is transmitted through the EC layer 22 as a drive signal is provided thereto. An EC layer 23 produces R (red) color through an oxidation-reduction reaction induced as a drive signal is provided via the corresponding transparent electrode 13 and common transparent electrode 14. This means that light in a wavelength range corresponding to R (red) in the incident light is transmitted through the EC layer 23 as a drive signal is provided thereto. At each EC layer among the EC layers 21, 22 and 23, the color produced as described above is sustained over a predetermined length of time even when the drive signal is no longer provided thereto, whereas the EC layers achieve a transparent (achromatic) state, in which light in the entire wavelength range having entered the filter unit 35 is transmitted through them when a reset signal is provided thereto.

As described above, the plurality of filter units 35 are each configured with three filters, i.e., an EC layer 21 that produces B (blue) color, an EC layer 22 that produces G (green) color and an EC layer 23 that produces R (red) color. When no drive signal is provided to any of the three types of EC layers 21, 22 and 23, a three-layer EC transmission wavelength range corresponding to W (white) is assumed. When a drive signal is provided to all three EC layers, 21, 22 and 23, a three-layer EC transmission wavelength range for BK (black) is assumed. When a drive signal is provided to the EC layer 21 alone, to the EC layer 22 alone or to the EC layer 23 alone, a three-layer EC transmission wavelength range corresponding to B (blue), G (green) or R (red) is assumed.

This means that light primarily in a specific wavelength range among the wavelength ranges corresponding to W (white), BK (black), R (red), G (green) and B (blue) can be allowed to be transmitted through a filter unit 35 by selecting a specific combination of transmission wavelengths for the EC layers 21 through 23.

In the following description, a pixel with the three-layer EC transmission wavelength range set for B (blue) in the filter unit 35 thereof will be referred to as a B pixel, a pixel with the three-layer EC transmission wavelength range set for G (green) in the filter unit 35 thereof will be referred to as a G pixel, and a pixel with the three-layer EC transmission wavelength range set for R (red) in the filter unit 35 thereof will be referred to as an R pixel. In addition, a pixel with the three-layer EC transmission wavelength range set for BK (black) in the filter unit 35 thereof will be referred to as a BK pixel or a light-shielded pixel, since incident light is blocked by the filter unit 35.

As explained above, the wavelength of light to be transmitted through the filter unit 35 is adjusted appropriately and the light component in the selected wavelength undergoes photoelectric conversion at each pixel 10. In addition, when light in the entire color range is transmitted through the filter unit 35, the W light component undergoes photoelectric conversion at the pixel 10, whereas when light in the entire color range is absorbed at the filter unit 35, the pixel 10 outputs a signal indicating a light-shielded state.

The filter control unit 60 in FIG. 2 sets (adjusts) the transmission wavelength for each filter unit 35 by controlling signals input to the filter unit 35 from the filter vertical drive unit 40 and the filter horizontal drive unit 50. The filter vertical drive unit 40 selects a specific row among a plurality of rows in which filter units 35 are disposed one after another i.e., it selects a specific transparent electrode among the plurality of transparent electrodes 11 through 13 and provides a drive signal to the selected transparent electrode. The filter horizontal drive unit 50 selects a specific column in which filter units 35 are disposed side by side, i.e., it selects a specific common transparent electrode among the plurality of common transparent electrodes 14, and provides a drive signal to the selected common transparent electrode. As a result, an EC layer corresponding to both the transparent electrode among the transparent electrodes 11 through 13 selected by the filter vertical drive unit 40 and the common transparent electrode 14 selected by the filter horizontal drive unit 50 produces a color.

For instance, the filter horizontal drive unit 50 may select the common transparent electrode 14 located at the right end, among the three common transparent electrodes 14 in FIG. 3(*b*), and provide a drive signal to the selected common transparent electrode 14, and the filter vertical drive unit 40 may select the transparent electrode 11 located at the upper end in FIG. 3(*b*) among the nine transparent electrodes 11 through 13 and provide a drive signal thereto. In such a case, the EC layer 21 located at the upper right end position will produce a color. In addition, if the filter horizontal drive unit 50 selects the common transparent electrode 14 at the right end and provides a drive signal thereto, and the filter vertical drive unit 40 selects the transparent electrode 12 located at the upper end and provides a drive signal thereto, the EC layer 22 at the upper right end produces a color. If the filter horizontal drive unit 50 selects the common transparent electrode 14 at the right end and provides a drive signal thereto and the filter vertical drive unit 40 selects the transparent electrode 13 located at the upper end and provides a drive signal thereto, the EC layer 23 at the upper right end produces a color.

The system control unit 110 in FIG. 2 controls the filter control unit 60, the pixel vertical drive unit 70, the column circuit unit 80, the horizontal scanning unit 90 and the output unit 100 based upon signals provided from the control unit 4 in the camera 1. The pixel vertical drive unit 70 provides control signals, such as a signal TX, a signal RST and a signal SEL which will be described later, to the various pixels 10, based upon signals provided from the system control unit 110, so as to control operations of the individual pixels 10.

The column circuit unit 80, configured so as to include a plurality of analog/digital conversion units (A/D conversion units), converts signals, which are input thereto via vertical signal lines 30 to be explained later from the individual pixels 10, to digital signals and outputs the digital signals resulting from the conversion to the horizontal scanning unit 90. The horizontal scanning unit 90 sequentially outputs the signals, having been output from the column circuit unit 80, to the output unit 100. The output unit 100, which includes a signal processing unit (not shown), executes signal processing such as correlated double sampling and signal level correction processing on the signals input thereto from the horizontal scanning circuit 90, and outputs the signals having undergone the signal processing to the control unit 4 in the camera 1. The output unit 100, having an input/output circuit and the like supporting a high-speed interface such as LVDS and SLVS, is able to transmit the signals to the control unit 4 at high speed.

Next, color mixing, i.e., cross-talk, that occurs at pixels located close to each other in the image sensor 3 will be explained. Color mixing occurs when a light flux having entered a given pixel leaks into a pixel located nearby or when an electric charge generated through photoelectric conversion at a given pixel leaks into a pixel located nearby. The following is a description of such color mixing, given in reference to FIG. 3(*a*).

In the image sensor 3, part of the light having been transmitted through the filter unit 35 of a pixel 10 may leak into the photoelectric conversion unit 32 of a pixel located near the pixel 10. In FIG. 3(*a*), a dotted line 61 schematically indicates how light enters the photoelectric conversion unit 32 of the pixel 10C after having been transmitted through the filter unit 35 of the pixel 10B. The photoelectric conversion unit 32 in the pixel 10C generates an electric charge based upon light transmitted through the filter unit 35 in the pixel 10B, in addition to an electric charge generated based upon the light transmitted through the filter unit 35 in the pixel 10C.

A dotted line 62 in FIG. 3(*a*) schematically indicates how part of the electric charge generated at the photoelectric conversion unit 32 in the pixel 10B leaks into the photoelectric conversion unit 32 in the pixel 10C. In this situation, the pixel 10C generates a pixel signal based upon both the electric charge generated at the photoelectric conversion unit 32 in the pixel 10C and the electric charge generated at the photoelectric conversion unit 32 in the pixel 10B.

As described above, a noise component attributable to color mixing occurring among nearby pixels may be present in pixel signals generated in the image sensor 3. Accordingly, the control unit 4 in the camera 1 determines a color mixing correction coefficient, which is information indicating the ratio of signal crosstalk among nearby pixels and eliminates the noise component attributable to color mixing from a pixel signal by correcting the pixel signal in conjunction with the color mixing correction coefficient, as will be explained in detail later.

In addition, a dark current occurs in the photoelectric conversion units 32 (photo diodes) disposed in the image sensor 3. A signal component attributable to the dark current in a pixel signal constitutes a noise component in the pixel signal. Accordingly, the control unit 4 in the camera 1 detects the dark current component by reading out a pixel signal from a light-shielded pixel at the image sensor 3, as will be explained in detail later. The control unit 4 then subtracts the dark current component from the pixel signal generated at the correction target pixel so as to eliminate the noise component attributable to the dark current from the pixel signal.

Figure 4:
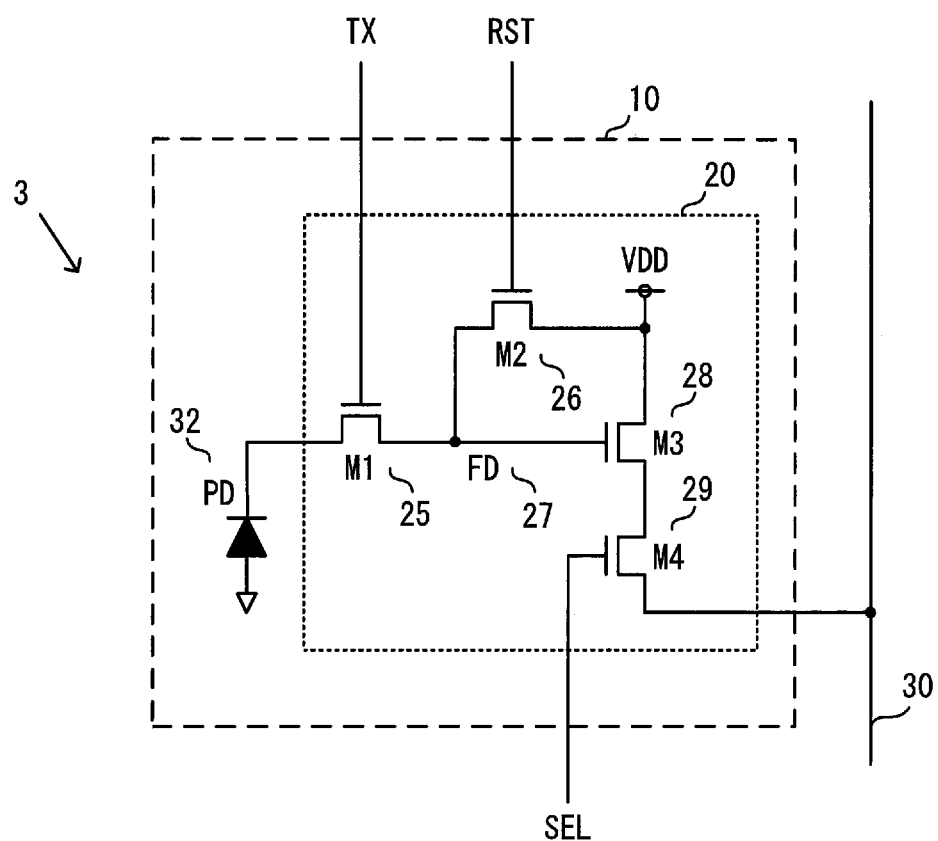

FIG. 4 is a circuit diagram presenting an example of the structure that may be adopted in a pixel 10 in the image sensor 3 achieved in the first embodiment. A pixel 10 includes a photoelectric conversion unit 32 described earlier and a readout unit 20. The readout unit 20 includes a transfer unit 25, a reset unit 26, a floating diffusion (hereafter referred to as an FD) 27, an amplifier unit 28 and a selection unit 29. The pixel vertical drive unit 70 shown in FIG. 2 provides control signals such as the signal TX, the signal RST and the signal SEL mentioned earlier to the individual pixels 10 so as to control operations of the pixels 10.

The transfer unit 25 transfers the electric charge resulting from the photoelectric conversion executed at the photoelectric conversion unit 32 to the floating diffusion 27 under control executed based upon a signal TX. Namely, the transfer unit 25 forms an electric charge transfer path between the photoelectric conversion unit 32 and the floating diffusion 27. The floating diffusion 27 holds (accumulates) an electric charge. The amplifier unit 28 amplifies a signal generated based upon the electric charge held in the floating diffusion 27 and outputs the amplified signal to a vertical signal line 30 via the selection unit 29. In the example presented in FIG. 2, the amplifier unit 28 is configured with a transistor M3, a drain terminal, a gate terminal and a source terminal of which are respectively connected to a source VDD, the floating diffusion 27 and the selection unit 29. The source terminal of the amplifier unit 28 is connected to a vertical signal line 30 via the selection unit 29. The amplifier unit 28 functions as part of a source follower circuit that uses a current source (not shown) as a load current source.

The reset unit 26, which is controlled based upon a signal RST, resets the electric charge at the floating diffusion 27 and resets the potential at the floating diffusion 27 to a reset potential (reference potential). The selection unit 29, which is controlled based upon a signal SEL, outputs the signal provided from the amplifier unit 28 to the vertical signal line 30. The transfer unit 25, the discharge unit 26 and the selection unit 29 may be respectively configured with, for instance, a transistor M1, a transistor M2 and a transistor M4.

Figure 5:
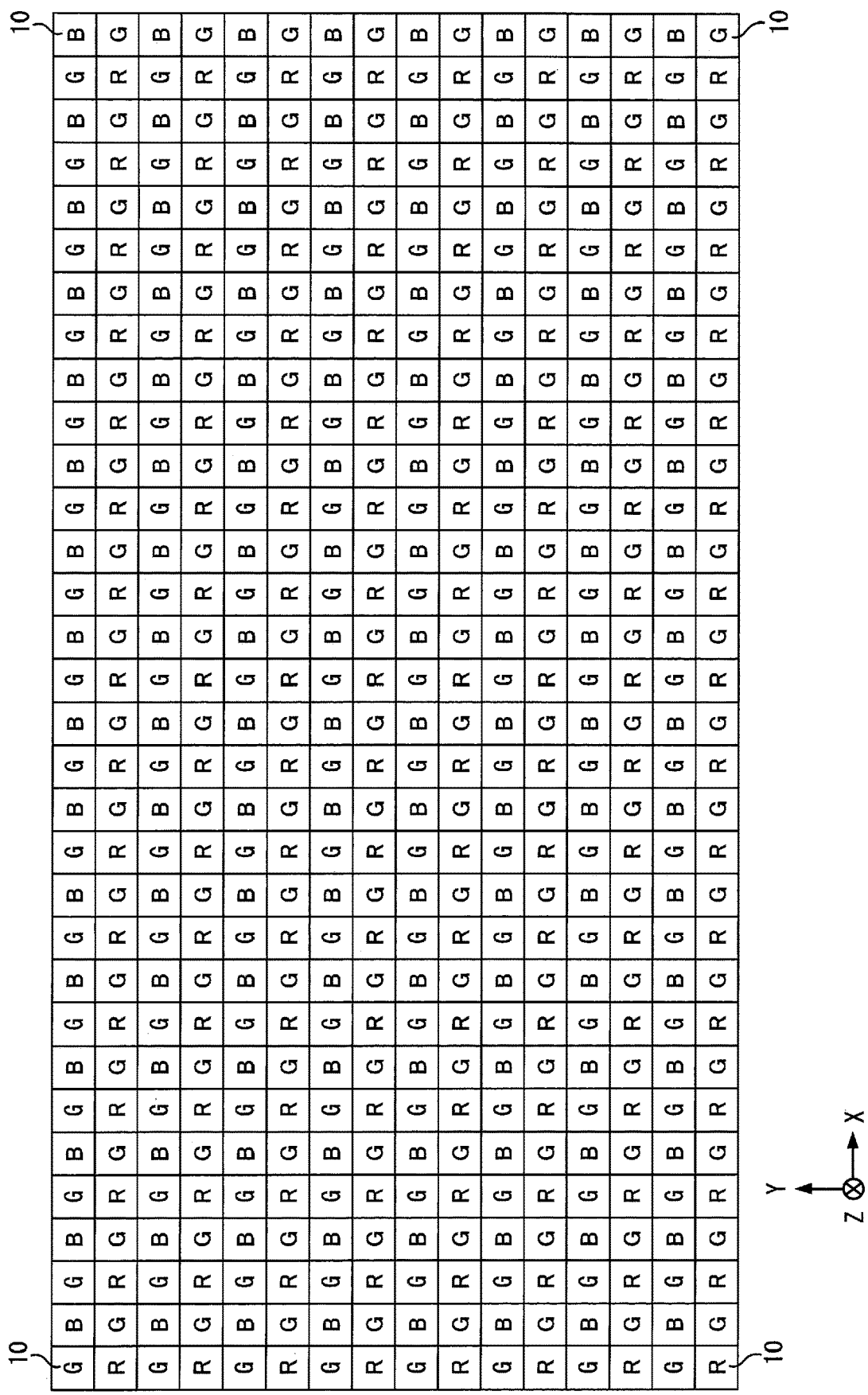
Figure 6:
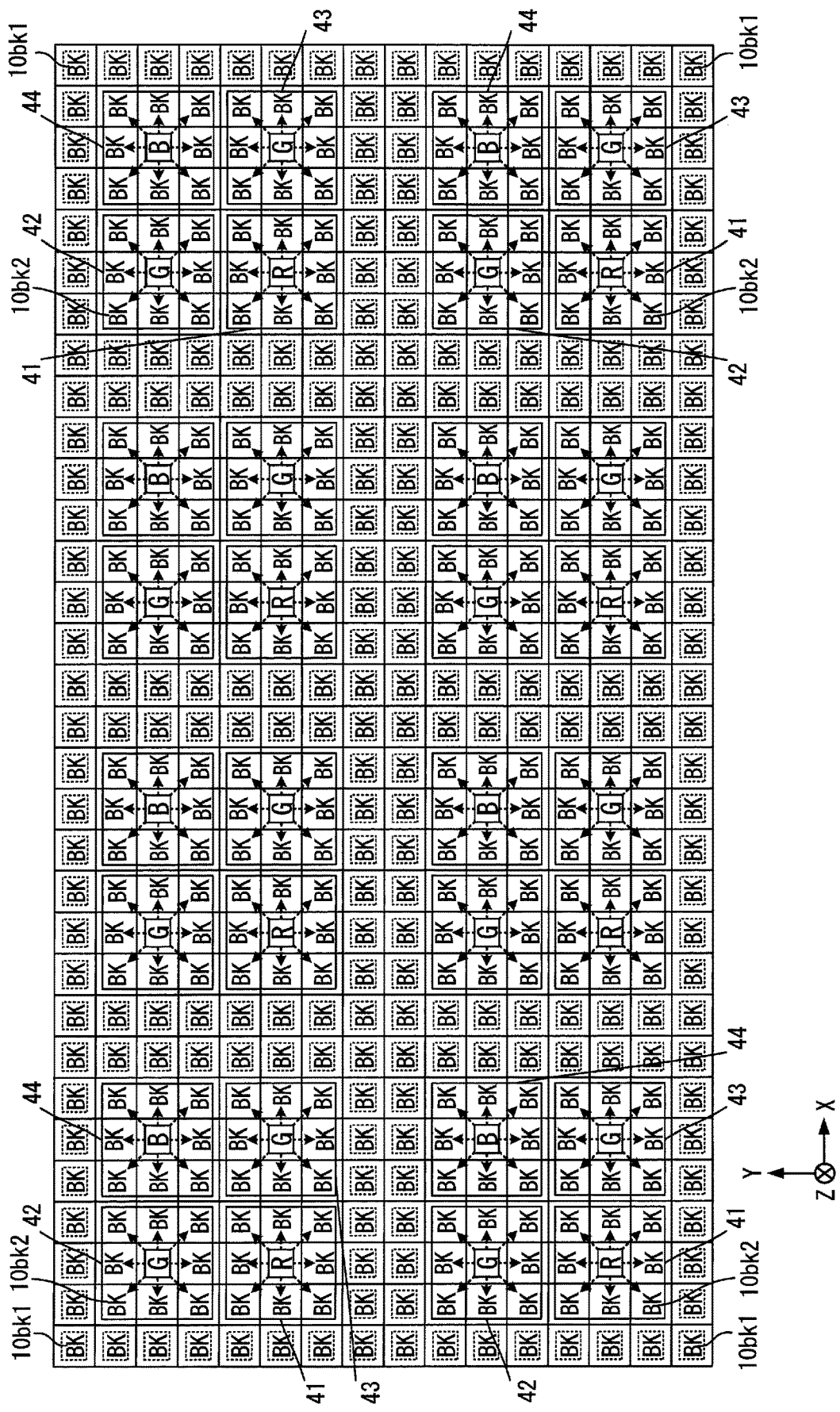

The filter units 35 in the image sensor 3 are switched to assume specific states for an image-capturing operation (hereafter referred to as a main image-capturing operation) executed to obtain pixel signals to be used for image data generation and for an image-capturing operation (hereafter referred to as a corrective image-capturing operation) executed to obtain pixel signals to be used for calculation of the dark current component and the color mixing correction coefficient. The filter control unit 60 controls the filter unit 35 in each pixel 10 so that the pixels 10 will form a Bayer array pattern when the image sensor 3 is engaged in a main image-capturing operation. FIG. 5 indicates incident light transmissive/light-shielding states with respect to incident light, assumed in the filter units 35 of the individual pixels for the main image-capturing operation. FIG. 6 indicates incident light transmissive/light-shielding states with respect to incident light, assumed in the filter units 35 of the individual pixels for the corrective image-capturing operation. As FIG. 5 indicates, the filter control unit 60 executes drive control of the filter units 35 for the main image-capturing operation so that a pixel column made up with G pixels 10 and B pixels 10 in alternate rows, and a pixel column made up with R pixels 10 and G pixels 10 in alternate rows, which take alternate column positions, extend side-by-side along the column direction in an repeating pattern.

For the corrective image-capturing operation, the filter control unit 60 controls the filter units 35 at the various pixels 10 so that some of the pixels 10 function as B pixels 10, G pixels 10 and R pixels 10 with the remaining pixels 10 to function as BK pixels 10, i.e., light-shielded pixels, as shown in FIG. 6. It is to be noted that in order to simplify the illustrations, FIG. 5 and FIG. 6 only show 32 pixels (across)×16 pixels (down).

FIG. 6 shows areas 41 each set for purposes of calculating color mixing correction coefficients in relation to adjacent pixels present next to an R pixel 10, areas 42 each set for purposes of calculating color mixing correction coefficients in relation to adjacent pixels present next to a G pixel 10, areas 43 each set for purposes of calculating color mixing correction coefficients in relation to adjacent pixels present next to a G pixel 10 and areas 44 each set for purposes of calculating color mixing correction coefficients in relation to adjacent pixels present next to an B pixel 10. The areas 41 through 44 in the embodiment are each made up with 3×3 pixels=9 pixels. An R pixel 10 takes the central position in an area 41 and the eight pixels surrounding the R pixel 10 in the area 41 are all BK pixels (light-shielded pixels) 10$bk2$. Likewise, a G pixel 10 takes the central position in each of the areas 42 and 43 and the eight pixels surrounding the G pixel 10 in the area 42 or 43 are BK pixels 10$bk2$. A B pixel 10 takes the central position in an area 44 and the eight pixels surrounding the B pixel 10 in the area 44 are all BK pixels 10$bk2$. It is to be noted that while an R pixel takes the position at the center of each area 41, the position of the area 41 is determined by ensuring that the pixel at the central position will function as an R pixel during an image-capturing operation, as well. This principle applies to the other areas 42 through 44 as well.

In addition, the size of the areas 41 through 44 is set to match the range over which the influence of color mixing, i.e., cross-talk, originating from the central pixel is in effect. This means that color mixing (cross-talk) originating from the R pixel 10 at the center of each area 41 only affects the surrounding eight pixels present adjacent to the R pixel 10 in the embodiment. If color mixing (crosstalk) affects pixels beyond the surrounding eight pixels, the range of the areas 41 through 44 will be set so as to contain those pixels present beyond the surrounding eight pixels, as well.

The four distinct areas 41 through 44 are set adjacent to each other along the up/down direction and the left/right direction in FIG. 6. Namely, the area 42 and the area 44 are set adjacent to each other along the left/right direction (along the row direction with respect to the pixel array) and the area 41 and the area 43 are set adjacent to each other along the left/right direction. The four areas 41 through 44 taking positions adjacent to one another, are present over the entire image-capturing surface of the image sensor 3, set apart substantially equidistant from one another along the up/down direction and the left/right direction.

The pixels 10 outside the areas 41 through 44 are all BK pixels 10, and the BK pixels 10 present outside the areas 41 through 44 are used for purposes of dark current measurement. The BK pixels 10$bk1$ used for purposes of dark current measurement are each shown inside a dotted line frame so as to clearly distinguish them from the BK pixels 10$bk2$ in the areas 41 through 44.

Next, calculation of the dark current component and the dark current component correction executed during an image-capturing operation will be explained. When executing a corrective image-capturing operation, the image sensor 3 controls the filter units 35 at the individual pixels 10 so as to set BK pixels 10$bk1$ for dark current measurement, as shown in FIG. 6. The BK pixels 10$bk1$ used for dark current measurement inside the dotted line frames, at which incident light does not enter the photoelectric conversion units 32, also remain unaffected by color mixing (crosstalk) originating from the central pixels in the areas 41 through 44 and thus, they each output a pixel signal corresponding to the amount of dark current in the particular BK pixel 10$bk1$. The correction unit 4a calculates a dark current component value based upon the pixel signal from each BK pixel 10$bk1$ used for the dark current measurement, output from the image sensor 3. The correction unit 4a stores the calculated dark current component value and information pertaining to the position of the specific BK pixel 10$bk1$ in correspondence to each other into the storage unit 4b.

When executing a main image-capturing operation, the image sensor 3 controls the filter units 35 at the pixels 10 so as to set R pixels 10, G pixels 10 and B pixels 10 in a Bayer array pattern, as shown in FIG. 5. The correction unit 4a subtracts the corresponding dark current component value stored in the storage unit 4b from a pixel signal output from each pixel at the image sensor 3 during the main image-capturing operation, thereby correcting the pixel signal. If a pixel signal obtained during the main image-capturing operation has been output from a pixel having been designated as a BK pixel 10$bk1$ for the dark current measurement in FIG. 6 during the corrective image-capturing operation, the correction unit 4a corrects the pixel signal based upon the dark current component value having been calculated in advance during the corrective image-capturing operation by using the pixel signal from the BK pixel 10$bk1$ used for the dark current measurement.

In conjunction with the central pixel inside each of the areas 41 through 44 shown in FIG. 6, a pixel signal corresponding to the amount of dark current is not generated during the corrective image-capturing operation, and for this reason, a dark current component value cannot be calculated in advance for the central pixel. Accordingly, if a pixel signal obtained during the main image-capturing operation has been output from a pixel designated as the central pixel inside each of the areas 41 through 44 in FIG. 6 for the corrective image-capturing operation, the correction unit 4a corrects the pixel signal based upon a dark current component value having been calculated in advance by using a pixel signal from a BK pixel 10bk1 used for the dark current measurement, which is present near the particular pixel, during the corrective image-capturing operation.

Since no pixel signal corresponding to the amount of dark current is generated for a pixel designated as a BK pixel 10bk2 within each of the areas 41 through 44 in FIG. 6 for the corrective image-capturing operation, a dark current component value cannot be calculated in advance for the BK pixel 10bk2. Accordingly, if a pixel signal obtained during the main image-capturing operation has been output from a pixel designated as a BK pixel 10bk2 inside each of the areas 41 through 44 in FIG. 6 for the corrective image-capturing operation, the correction unit 4a corrects the pixel signal based upon a dark current component value having been calculated in advance by using a pixel signal at a nearby BK pixel 10bk1 used for dark current measurement, which is located near the particular pixel, during the corrective image-capturing operation. Through the processing executed as described above, the correction unit 4a is able to eliminate the noise component attributable to the dark current from the pixel signal at the correction target pixel.

Next, calculation of a color mixing correction coefficients and elimination of the noise component attributable to color mixing occurring during an image-capturing operation will be explained. The image sensor 3, executing a corrective image-capturing operation, calculates color mixing correction coefficients by controlling the filter units 35 in the individual pixels 10 so as to form the plurality of areas 41 through 44 with the pixels shown in FIG. 6. For instance, color mixing (crosstalk) originating from an R pixel 10 at the center of an area 41 affects the eight BK pixels 10bk2 adjacent to the central pixel. As a result, the adjacent BK pixels 10bk2 each output a pixel signal (noise signal) attributable to the color mixing.

The correction unit 4a in the control unit 4 compares the pixel signal output from the R pixel 10 and the pixel signal output from an adjacent BK pixel 10bk2 so as to calculate the ratio (r1/R1) of the pixel signal r1 manifesting at the adjacent pixel BK 10bk2 to the pixel signal R1 generated at the R pixel 10, i.e., a color mixing correction coefficient, in correspondence to each of the adjacent BK pixels 10bk2. For instance, the correction unit 4a compares the pixel signal output from the R pixel 10 in each area 41 with the pixel signal from the BK pixel 10bk2 taking the position directly above the R pixel 10 (the pixel offset by one pixel position along the Y direction), so as to calculate a color mixing correction coefficient pertaining to the signal component originating from the R pixel 10 and entering the BK pixel 10bk2 taking the position above the R pixel 10.

Likewise, the correction unit 4a calculates a color mixing correction coefficient for the signal component originating from the R pixel 10 and entering the BK pixel 10bk2 diagonally above the R pixel 10 to the right (i.e. the pixel offset by one pixel position along the X direction and by one pixel position along the Y direction), a color mixing correction coefficient for the signal component originating from the R pixel 10 and entering the BK pixel 10bk2 located to the right relative to the R pixel 10 (i.e., the pixel offset by one pixel position along the X direction) and a color mixing correction coefficient for the signal component originating from the R pixel 10 and entering the BK pixel 10bk2 diagonally below the R pixel 10 to the right (i.e., the pixel offset by one pixel position along the X direction and offset by one pixel position along the −Y direction). In addition, the correction unit 4a calculates a color mixing correction coefficient for the signal component originating from the R pixel 10 and entering the BK pixel 10bk2 directly below the R pixel 10 (i.e. the pixel offset by one pixel position along the −Y direction), a color mixing correction coefficient for the signal component originating from the R pixel 10 and entering the BK pixel 10bk2 diagonally below the R pixel 10 to the left (i.e., the pixel offset by one pixel position along the −X direction and offset by one pixel position along the −Y direction), a color mixing correction coefficient for the signal component originating from the R pixel 10 and entering the BK pixel 10bk2 located to the left relative to the R pixel 10 (i.e., the pixel offset by one pixel position along the −X direction) and a color mixing correction coefficient for the signal component originating from the R pixel 10 and entering the BK pixel 10bk2 diagonally above the R pixel 10 to the left (i.e., the pixel offset by one pixel position along the −X direction and offset by one pixel position along the Y direction). Through this process, the correction unit 4a obtains a total of eight color mixing correction coefficients in relation to the R pixel 10, each in correspondence to one of the BK pixels 10bk2 taking positions above, below, to the left, to the right, diagonally above and diagonally below relative to the R pixel 10 in the area 41.

It is to be noted that the correction unit 4a may calculate color mixing correction coefficients based upon pixel signals that do not contain the dark current component by first subtracting the dark current component from the pixel signals generated at the pixels in the areas 41 through 44 prior to executing the color mixing correction coefficient calculation as described above. For instance, the value representing the dark current component in the BK pixel 10bk1 present at the position closest to a given pixel 10 in each of the areas 41 through 44, among the plurality of BK pixels 10bk1 used for dark current measurement, may be subtracted from the pixel signal generated at the pixel 10 in the particular area. Color mixing correction coefficients are calculated by using pixel signals from which the dark current component has been eliminated as described above, and thus the correction unit 4a is able to calculate highly accurate color mixing correction coefficients.

In addition, through similar processing executed for the areas 42 through 44, the correction unit 4a is able to calculate color mixing correction coefficients pertaining to color mixing originating in the G pixels 10 in the areas 42, in the G pixels 10 in the areas 43 and in the B pixels 10 in the area 44 and affecting the adjacent pixels. The correction unit 4a stores the color mixing correction coefficients having been calculated and position information pertaining to the positions of the BK pixels 10 bk2 in correspondence to each other into the storage unit 4b.

Furthermore, since all the pixels adjacent to the areas 41 through 44 are designated as BK pixels 10bk1 used for dark current measurement at the image sensor 3 as shown in FIG. 6, color mixing does not originate from these adjacent pixels to affect the BK pixels 10bk2 in the areas 41 through 44. This means that the correction unit 4a is able to calculate color mixing correction coefficients with high accuracy by using the pixel signals generated at the BK pixels 10bk2 in the areas 41 through 44. As a result, the accuracy of the correction processing executed by the correction unit 4a can be improved.

Next, correction of the noise component attributable to color mixing, i.e., elimination of the noise component, during the image-capturing operation will be explained. The correction unit 4a executes correction processing on pixel signals generated during a main image-capturing operation by using the color mixing correction coefficients stored in the storage unit 4b. The correction unit 4a corrects the pixel signal generated at a correction target pixel by using the color mixing correction coefficients pertaining to the signal components entering the correction target pixel from the pixels taking positions above, below, to the left, to the right, diagonally above and diagonally below relative to the correction target pixel. During this processing, the correction unit 4a calculates color mixing correction coefficients to be used to correct the pixel signal at the pixel designated as the correction target based upon the color mixing correction coefficients pertaining to the BK pixels 10bk2 in the areas 41 through 44 stored in the storage unit 4b.

If the correction target pixel is an R pixel, the correction unit 4a individually calculates a color mixing correction coefficient for the signal component entering the R pixel from the G pixel present above the R pixel, a color mixing correction coefficient for the signal component entering the R pixel from the B pixel taking the position diagonally above the R pixel to the right and a color mixing correction coefficient for the signal component entering the R pixel from the G pixel taking the position to the right of the R pixel. In addition, the correction unit 4a individually calculates a color mixing correction coefficient for the signal component entering the R pixel from the B pixel taking the position diagonally below the R pixel to the right, a color mixing correction coefficient for the signal component entering the R pixel from the G pixel below the R pixel and a color mixing correction coefficient for the signal component entering the R pixel from the B pixel taking the position diagonally below the R pixel to the left. The correction unit 4a further calculates a color mixing correction coefficient for the signal component entering the R pixel from the G pixel taking the position to the left of the R pixel and a color mixing correction coefficient for the signal component entering the R pixel from the B pixel taking the position diagonally above the R pixel to the left.

The correction unit 4a calculates a color mixing correction coefficient for a correction target pixel based upon the color mixing correction coefficients corresponding to the BK pixels 10bk2 in the areas 41 through 44. For instance, the correction unit 4a may use the color mixing correction coefficient calculated in advance for the BK pixel 10bk2 taking the position closest to the correction target pixel, among the BK pixels 10bk2 in the areas 41 through 44, as the color mixing correction coefficient for the correction target pixel.

It is to be noted that the correction unit 4a may instead use the average value of the color mixing correction coefficients calculated in advance for three BK pixels 10bk2 present near the correction target pixel, among the BK pixels 10bk2 in the areas 41 through 44, as the color mixing correction coefficient for the correction target pixel. However, no particular limitations are imposed with respect to the number of BK pixels 10bk2 to be used for calculation of the color mixing correction coefficient average value and it may be calculated by averaging the color mixing correction coefficients having been calculated for two BK pixels 10bk2 or it may be calculated by averaging the color mixing correction coefficients having been calculated for four BK pixels 10bk2. Furthermore, the correction unit 4a may calculate luminance values each in correspondence to one of the pixels, and may use the color mixing correction coefficient corresponding to the BK pixel 10bk2 taking the position closest to the correction target pixel, among the BK pixels 10bk2 having luminance values close to the luminance value at the correction target pixel, as the color mixing correction coefficient for the correction target pixel. In this situation, luminance values cannot be determined based upon the pixel signals generated at the BK pixels 10bk2 during the corrective image-capturing operation and for this reason, an image-capturing operation will need to be executed for purposes of luminance value calculation so as to calculate luminance values at BK pixels 10bk2. It is to be noted that the correction unit 4a may instead calculate a color mixing correction coefficient for the correction target pixel through the method disclosed in PTL 1. For instance, the correction unit 4a may calculate a color mixing correction coefficient through the method of linear interpolation described in PTL 1.

The correction unit 4a calculates a color mixing noise component in the pixel signal generated at the correction target pixel by multiplying a pixel signal at a pixel adjacent to the correction target pixel by the color mixing correction coefficient having been calculated for the correction target pixel and subtracts the value representing the color mixing noise component thus calculated from the pixel signal at the correction target pixel. If the correction target pixel is an R pixel, the correction unit 4a determines the noise components entering the R pixel from the eight pixels adjacent to the correction target pixel by individually multiplying the pixel signals at the eight adjacent pixels by the color mixing correction coefficients each pertaining to the noise component entering the correction target pixel from one of the eight pixels. The correction unit 4a is able to eliminate the noise components attributable to color mixing from the pixel signal at the correction target pixel by subtracting the noise components originating from the adjacent pixels having been calculated as described above from the pixel signal at the correction target pixel. Namely, a color mixing correction coefficient to be used to correct the signal at the correction target pixel can be calculated by using the color mixing correction coefficients corresponding to the plurality of BK pixels 10bk2 set over the entire area of the image sensor 3 for the corrective image-capturing operation in the embodiment. Consequently, the color mixing correction coefficient for the correction target pixel can be calculated with high accuracy, which, in turn, makes it possible to improve the accuracy of the correction processing.

Figure 7:
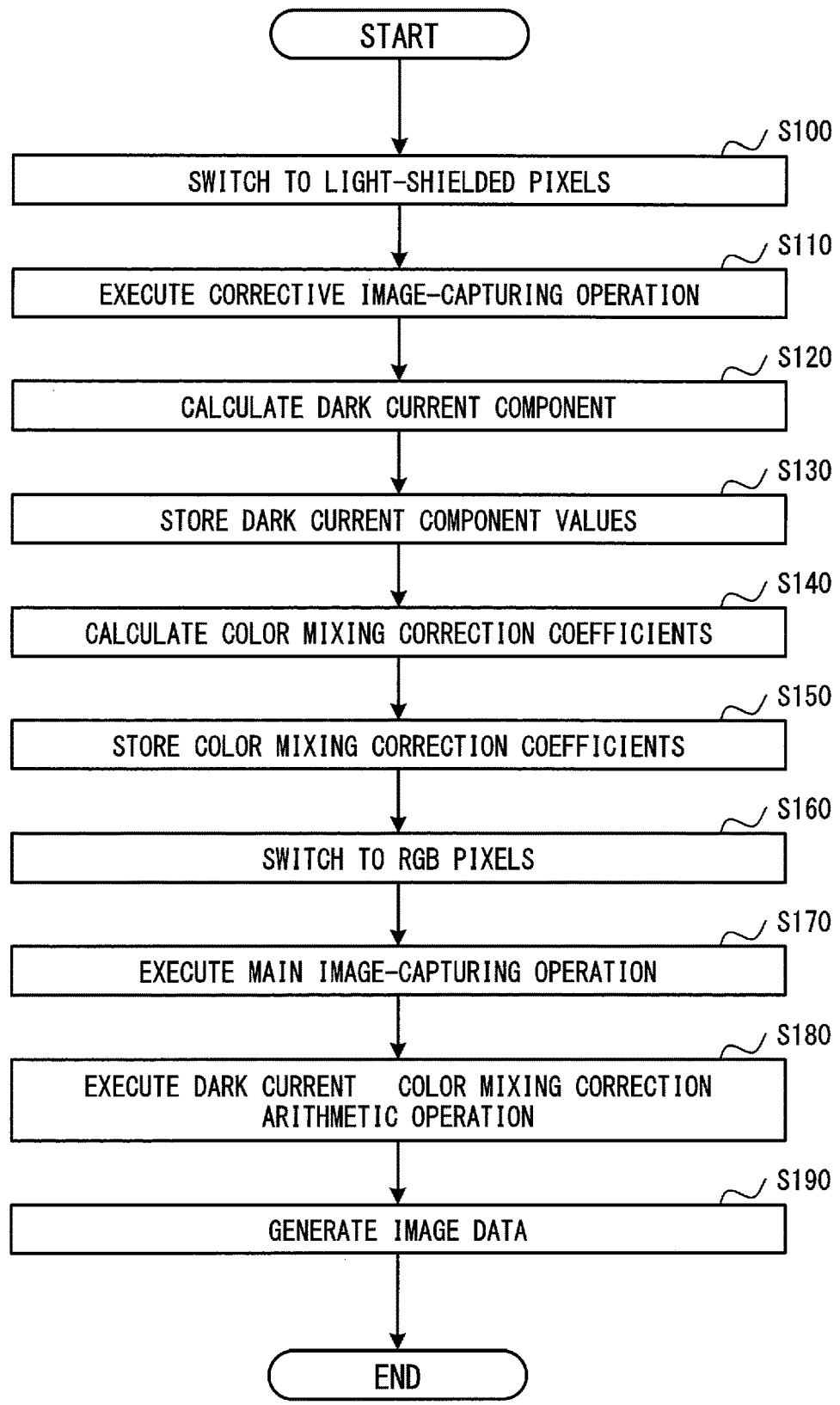

FIG. 7 presents a flowchart of an example of an operation that may be executed in the image-capturing device 1 in the first embodiment. An example of an operation that may be executed in the image-capturing device 1 will be explained in reference to the flowchart presented in FIG. 7, as well as FIGS. 5 and 6. The processing in FIG. 7 is executed as a photographing instruction is issued in response to, for instance, a user operation at the shutter release button.

In step S100, the filter control unit 60 in the image sensor 3 controls the filter units 35 at the individual pixels 10 so as to set BK pixels 10bk1 for dark current measurement and pixels forming the plurality of areas 41 through 44, as shown in FIG. 6. The processing in step S100 does not need to be executed prior to each main image-capturing operation and may, for instance, be executed each time the power is turned on at the camera 1.

In step S110, the control unit 4 engages the image sensor 3 in a corrective image-capturing operation and reads out pixel signals from the pixels 10 set as shown in FIG. 6. In step S120, the correction unit 4a in the control unit 4 calculates values representing the dark current component based upon the pixel signals at the BK pixels 10bk1 for the dark current measurement, output from the image sensor 3. In step S130, the correction unit 4a stores the dark current component values having been calculated and information pertaining to the positions of the BK pixels 10bk1 in correspondence to each other into the storage unit 4b.

In step S140, the correction unit 4a calculates color mixing correction coefficients pertaining to the BK pixels 10bk2 adjacent to the central pixel based upon the pixel signals generated at the pixels 10 in each of the areas 41 through 44. In step S150, the correction unit 4a sets the color mixing correction coefficient having been calculated in correspondence to the pixels for which the color mixing correction coefficients are to be used and stores the color mixing correction coefficients and position information indicating the positions of the corresponding pixels into the storage unit 4b. It is to be noted that when the focal length of the image-capturing optical system 2 has been altered, lenses have been changed at the image-capturing optical system 2, the aperture value or the shutter speed has been adjusted, the transmission wavelengths at the filter units 35 have been adjusted or the like, the control unit 4 may recalculate dark current component values and color mixing correction coefficients by executing the processing in steps S100 through S150. In addition, the control unit 4 may obtain dark current component values and color mixing correction coefficients by executing the processing in steps S100 through S150 prior to product shipment.

In step S160, the filter control unit 60 in the image sensor 3 controls the filter units 35 so as to set R pixels 10, G pixels 10 and B pixels 10 in a Bayer array pattern, as shown in FIG. 5. In step S170, the control unit 4 engages the image sensor 3 in a main image-capturing operation.

In step S180, the correction unit 4a corrects the pixel signals generated at the individual pixels 10 through the main image-capturing operation by using the dark current component values and the color mixing correction coefficients stored in the storage unit 4b. Through this process, the correction unit 4a eliminates the noise component attributable to the dark current and the noise component attributable to color mixing from each pixel signal. In step S190, the image generation unit 4c generates image data based upon the pixel signals having been corrected by the correction unit 4a.

The following advantages and operations are achieved through the embodiment described above.

(1) The camera 1 comprises a first pixel and a second pixel each having a filter unit 35 that can be switched to a light-shielding state in which incident light is blocked or to a transmissive state in which light at a specific wavelength in the incident light is selectively transmitted, a photoelectric conversion unit 32 that generates an electric charge through photoelectric conversion of light transmitted through the filter unit 35 and an output unit (readout unit 20) that outputs a signal generated based upon the electric charge generated at the photoelectric conversion unit 32, and a correction unit 4a that corrects a signal output from the output unit in the first pixel while the filter unit 35 of the first pixel is in a transmissive state by using a signal output from the output unit of the first pixel with the filter unit 35 thereof set in a light-shielding state and with the filter unit 35 of the second pixel set in a transmissive state. In the camera 1 achieved in the embodiment, a pixel signal generated at a given pixel 10 set in a transmissive state is corrected by using a color mixing correction coefficient calculated by setting the pixel 10 in a light-shielded state. As a result, more rigorous correction is enabled and the accuracy of the correction processing can be improved. In addition, by using corrected pixel signals, a high quality image (data) can be generated.

(2) The pixels 10 in the camera 1 achieved in the embodiment each include a filter unit 35 that can be set to a light-shielding in which incident light is blocked or to a state in which light at a specific wavelength in the incident light is selectively transmitted. Thus, color mixing correction coefficients and dark current component values can be calculated by setting individual pixels 10 in a light-shielded state and a subject image can be captured by setting the pixels 10 in a transmissive state. This means that since no pixels need to be set in a light-shielded state during the main image-capturing operation for purposes of obtaining color mixing correction coefficients and dark current component values, the main image-capturing operation can be executed without creating any dead pixels. In addition, since pixel signals to be used for purposes of image data generation can be obtained from all the pixels, a high quality image (data) can be generated.

(3) The camera 1 achieved in the embodiment includes filter units 35, the transmission wavelength of which can be adjusted in correspondence to each pixel 10. This allows the control unit 4 to set BK pixels 10bk1 for dark current measurement and areas 41 through 44 for color mixing correction coefficient calculation at desired positions. In addition, by setting the dark current measurement pixels and the areas 41 through 44 over the entire range of the image-capturing area as shown in FIG. 6, a dark current component value and a color mixing correction coefficient can be accurately determined for each pixel.

Second Embodiment

Figure 8:
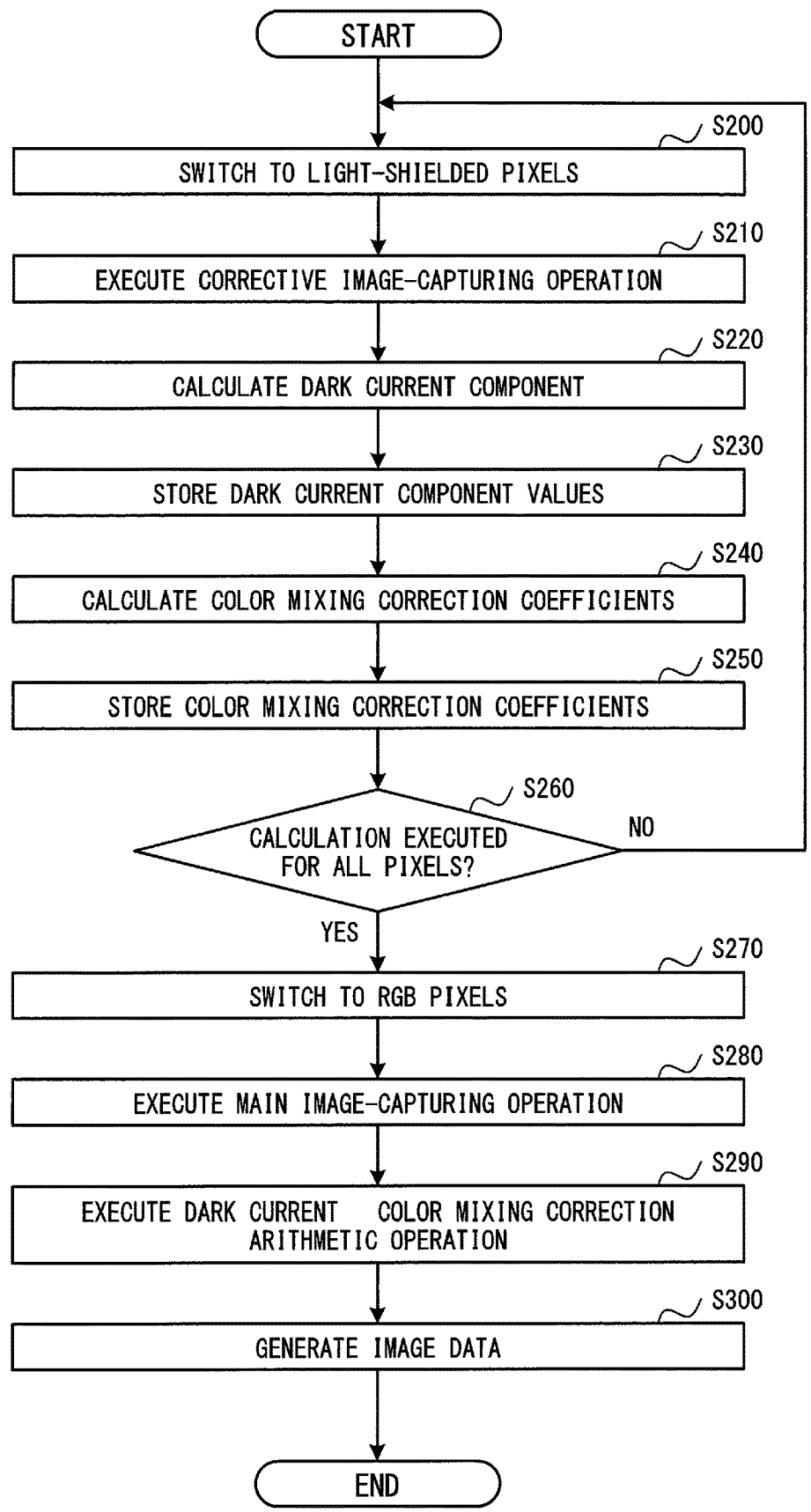

The image-capturing device achieved in the second embodiment will be described in reference to drawings. The image-capturing device in the second embodiment adopts a structure similar to that of the image-capturing device 1 in FIG. 1. The image-capturing device in the second embodiment calculates values representing the dark current component for all the pixels disposed at the image sensor 3. FIG. 8 presents a flowchart of an example of an operation that may be executed in the image-capturing device 1 in the second embodiment. An example of an operation that may be executed in the image-capturing device 1 will be explained in reference to FIG. 9 and the like, as well as the flowchart presented in FIG. 8. It is to be noted that in the figures, the same reference signs are assigned to components identical to or equivalent to those in the first embodiment and that the following description will focus on features unique to the second embodiment.

In step S200, the filter control unit 60 in the image sensor 3 controls the filter units 35 at the individual pixels 10 as in the first embodiment so as to set the BK pixels 10bk1 for dark current measurement and the pixels forming the plurality of areas 41 through 44 as shown in FIG. 6.

In step S210, the control unit 4 engages the image sensor 3 in a corrective image-capturing operation and reads out pixel signals from the pixels 10 at the image sensor 3. In step S220, the correction unit 4a in the control unit 4 calculates values representing the dark current component based upon the pixel signals at the BK pixels 10bk1 for the dark current measurement output from the image sensor 3. In step S230, the correction unit 4*a* stores the dark current component values having been calculated and information pertaining to the positions of the BK pixels 10*bk*1 in correspondence to each other into the storage unit 4*b*.

In step S240, the correction unit 4*a* calculates color mixing correction coefficients pertaining to the BK pixels 10*bk*2 adjacent to the central pixel based upon the pixel signals generated at the pixels 10 in each of the areas 41 through 44. In step S250, the correction unit 4*a* stores the color mixing correction coefficients and position information indicating the positions of the corresponding BK pixels bk2 into the storage unit 4*b*.

In step S260, the correction unit 4*a* makes a decision as to whether or not there is a pixel for which a dark current component value has not yet been calculated. If dark current component values have been calculated for all the pixels, the correction unit 4*a* proceeds to execute the processing in step S270, whereas if dark current component values have not yet been calculated for all the pixels, the operation returns to step S200.

Figure 9:
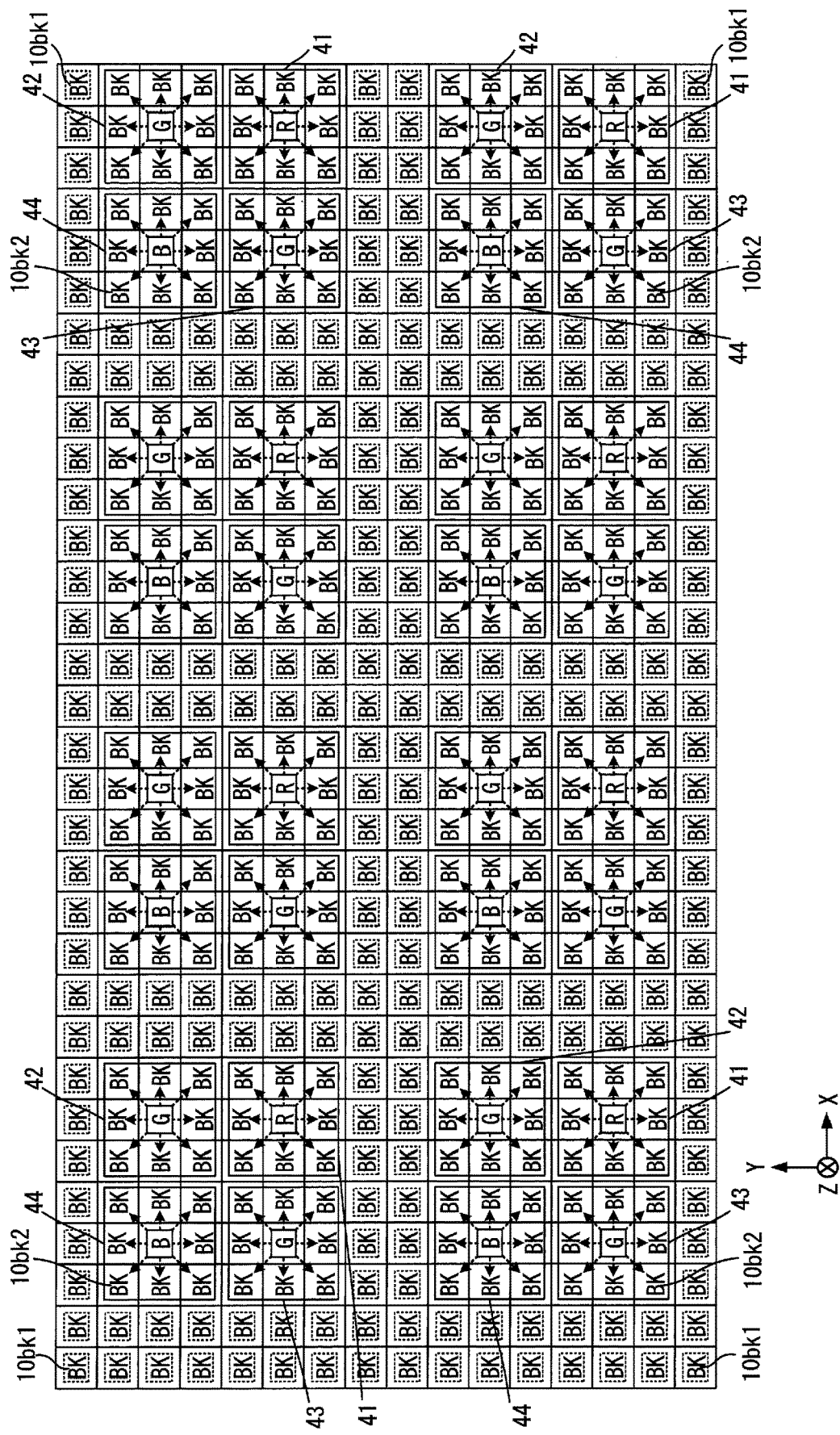

Once the operation returns to step S200, the filter control unit 60 in the image sensor 3 controls the filter units 35 in the individual pixels 10 so as to alter the positions of BK pixels 10. For instance, the filter control unit 60 may set areas 41 through 44 at new, different positions, as shown in FIG. 9. In FIG. 9, some of the BK pixels 10*bk*2 in the areas 41 through 44 in FIG. 6 are reassigned as central pixels in the new areas 41 through 44. As a result, the control unit 4*a* is able to individually calculate dark current component values at the BK pixels 10*bk*1 used for dark current measurement in FIG. 6 and dark current component values at the BK pixels 10*bk*1 used for dark current measurement in FIG. 9.

In step S270, the filter control unit 60 in the image sensor 3 controls the filter units 35, as in the first embodiment, so as to set R pixels 10, G pixels 10 and B pixels 10 in a Bayer array pattern, as shown in FIG. 5. In step S280, the control unit 4 engages the image sensor 3 in a main image-capturing operation.

In step S290, the correction unit 4*a* corrects the pixel signals generated at the individual pixels 10 through the main image-capturing operation by using the dark current component values and the color mixing correction coefficients stored in the storage unit 4*b*. Through this process, the correction unit 4*a* eliminates the noise component attributable to the dark current and the noise component attributable to color mixing from each pixel signal. In step S300, the image generation unit 4*c* generates image data based upon the pixel signals having been corrected by the correction unit 4*a*.

As explained above, the image-capturing device 1 in the embodiment is able to obtain dark current component values for all the pixels through dark current component calculation processing, repeatedly executed by switching positions of the BK pixels 10. In addition, since the pixel signal generated at each pixel is corrected by using the dark current component value and the color mixing correction coefficient calculated for the particular pixel among all the pixels disposed in the image sensor 3, rigorous correction is achieved and thus, the accuracy of the correction processing can be improved. Furthermore, by using the corrected pixel signals, a high quality image (data) can be generated.

It is to be noted that while an example in which dark current component values are calculated for all the pixels has been explained in reference to the embodiment, color mixing correction coefficients for all the pixels may be calculated instead of calculating dark current component values for all the pixels. In such a case, the correction unit 4*a* will make a decision in step S260 as to whether or not there is any pixel for which a color mixing correction coefficient has not been calculated. If color mixing correction coefficients for all the pixels have been calculated, the correction unit 4*a* will proceed to execute the processing in step S270, whereas if color mixing correction coefficients have not yet been calculated for all the pixels, the operation will return to step S200. Once the operation returns to step S200, the filter control unit 60 will control the filter units 35 in the individual pixels 10 so as to set areas 41 through 44 at new, different positions, as shown, for instance, in FIG. 9. In this case, the correction unit 4*a* will be able to individually calculate color mixing correction coefficients at the BK pixels 10*bk*2 in the areas 41 through 44 in FIG. 6 and color mixing correction coefficients at the BK pixels 10*bk*2 in the areas 41 through 44 in FIG. 9. In addition, the control unit 4 may repeatedly execute the processing in step S200 through step S260 so as to obtain both dark current component values and color mixing correction coefficients for all the pixels.

In the embodiment, a color mixing correction coefficient to be used to calculate a noise component that originates in a given pixel and enters an adjacent pixel, and a color mixing correction coefficient to be used to calculate a noise component that originates in an adjacent pixel and enters the given pixel, can be obtained in correspondence to each pixel.

In the embodiment, dark current component values and color mixing correction coefficients are calculated in correspondence to all the pixels, which is bound to result in a longer processing time required for the calculation of the dark current component values and the color mixing correction coefficients. It is thus desirable that the control unit 4 execute the processing in step S200 through step S260 to obtain the dark current component values and the color mixing correction coefficients for all the pixels prior to product shipment. It is to be noted that when the focal length of the image-capturing optical system 2 has been altered, the lenses have been changed at the image-capturing optical system 2, the aperture value or the shutter speed has been adjusted, the transmission wavelengths at the filter units 35 have been adjusted or the like, the control unit 4 may recalculate dark current component values and color mixing correction coefficients for all the pixels by executing the processing in steps S200 through S260. In addition, the control unit 4 may recalculate dark current component values and color mixing correction coefficients in correspondence to all the pixels by executing the processing in step S200 through step S260 in response to a photographing instruction issued by the user through an operation at the shutter release button.

It is to be noted that in the embodiment described above, dark current component values and color mixing correction coefficients are calculated each in correspondence to one of the pixels. However, the image sensor 3 may include a very large number of pixels, and in such a case, dark current component values and color mixing correction coefficients may be calculated in correspondence to some of the pixels 10. For instance, pixels for which dark current component values and color mixing correction coefficients are to be calculated may be selected by skipping pixels in specific rows or columns, among all the pixels 10, and dark current component values and color mixing correction coefficients may be calculated for the selected pixels only.

The following variations are also within the scope of the present invention and one of the variations or a plurality of variations may be adopted in combination with either of the embodiments described above.

(Variation 1)

In the embodiments described above, BK pixels 10bk1 for dark current measurement and pixels to form a plurality of areas 41 through 44 are set in order to calculate dark current component values and color mixing correction coefficients. As an alternative, the control unit 4 may control the filter units 35 at the individual pixels 10 so as to assign all the pixels 10 to function as BK pixels 10bk1 for dark current measurement. In this case, the control unit 4 is able to obtain a dark current component value in correspondence to each pixel at the image sensor 3. It is to be noted that the control unit 4 may set only areas 41 through 44 for purposes of color mixing correction coefficient calculation to obtain color mixing correction coefficients alone.

(Variation 2)

Figure 10:
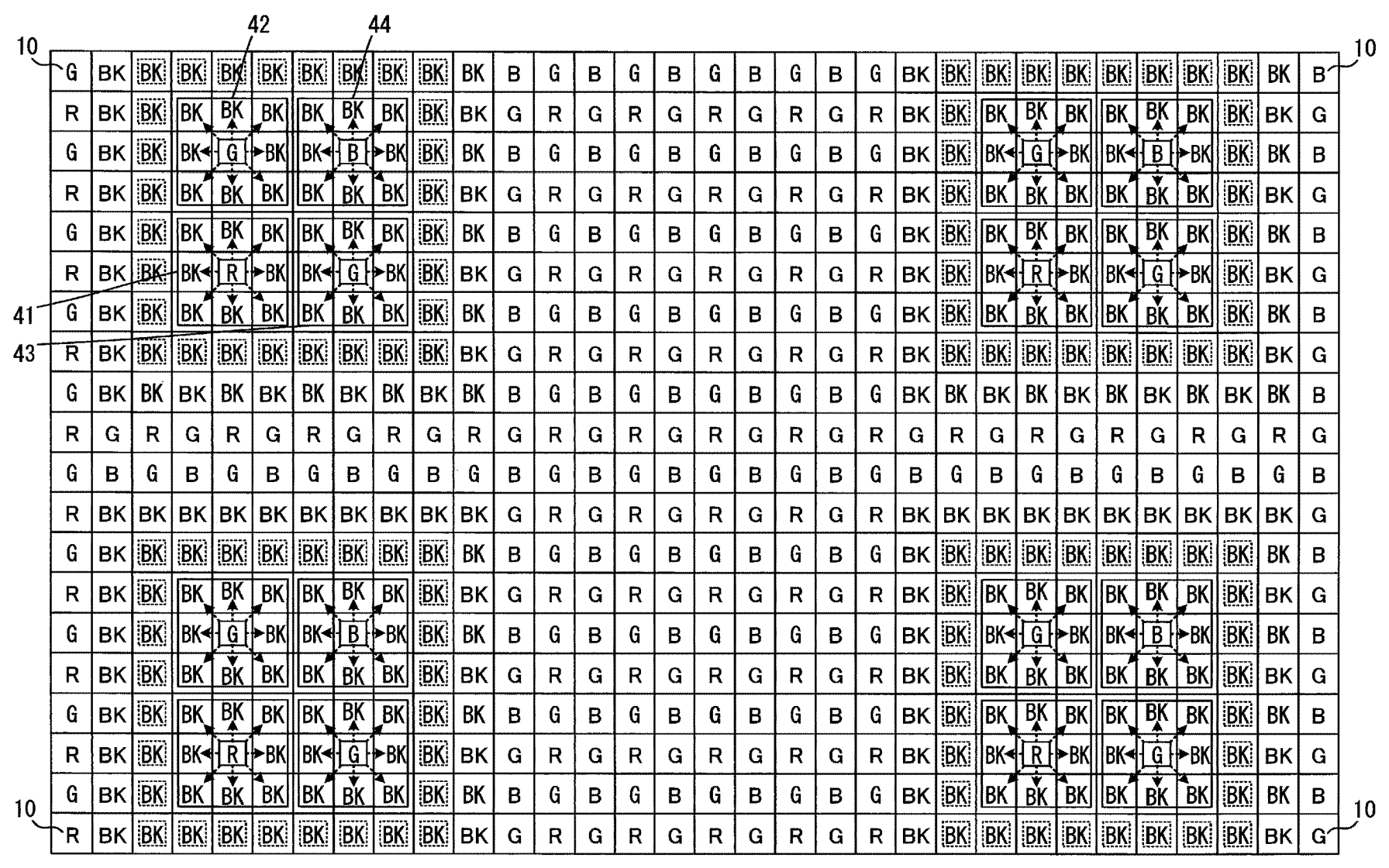

In the embodiments described above, an image-capturing operation is executed by assigning the pixels to function as R pixels 10, G pixels 10 and B pixels 10 after obtaining dark current component values and color mixing correction coefficients in conjunction with dark current measurement pixels and areas 41 through 44 set over the entire range of the image-capturing area. As an alternative, the control unit 4 may control the filter units 35 at the individual pixels 10 so as to set BK pixels 10bk1 for dark current measurement and areas 41 through 44 only over part of the image-capturing area, as illustrated in FIG. 10. In this case, the control unit 4 will be able to calculate dark current component values and color mixing correction coefficients and also generate image data by using the pixel signals generated at the individual pixels 10 during an image-capturing operation. The image generation unit 4c in this variation will generate image data by obtaining a pixel signal for each BK pixel 10, used for the calculation of a dark current component value or a color mixing correction coefficient, through interpolation executed based upon pixel signals generated at nearby pixels present around the BK pixel 10.

(Variation 3)

Figure 11:
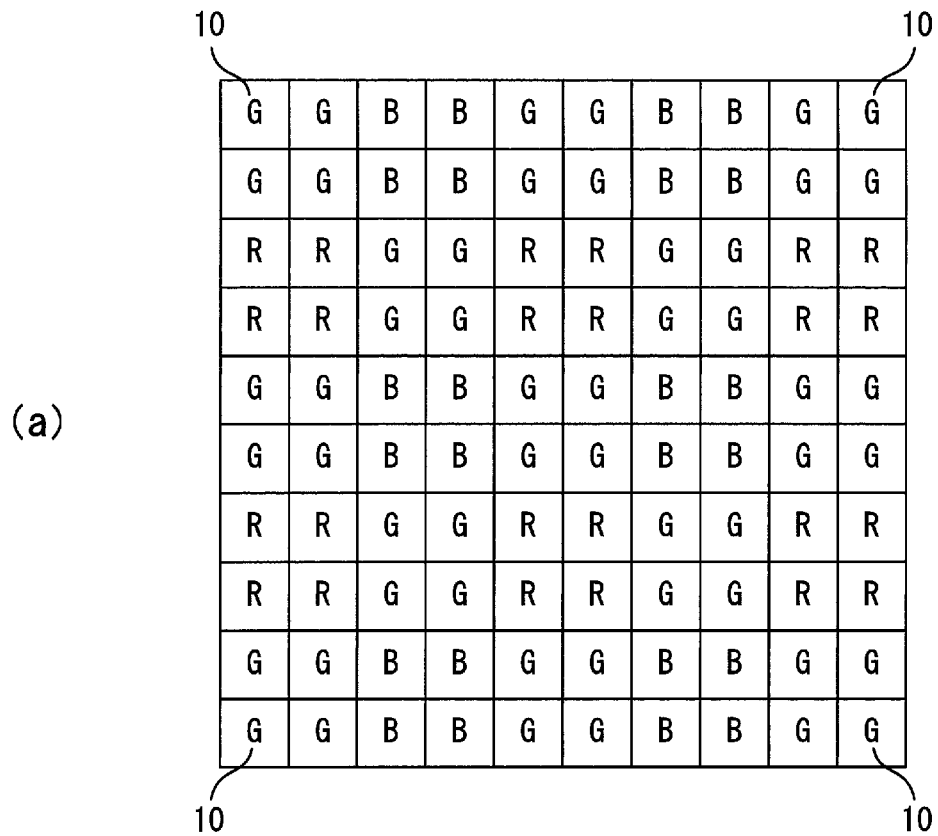
FIG. 11 A diagram presenting an example of a state that may be assumed with respect to the filter units at the image sensor in variation 3
Figure 11:
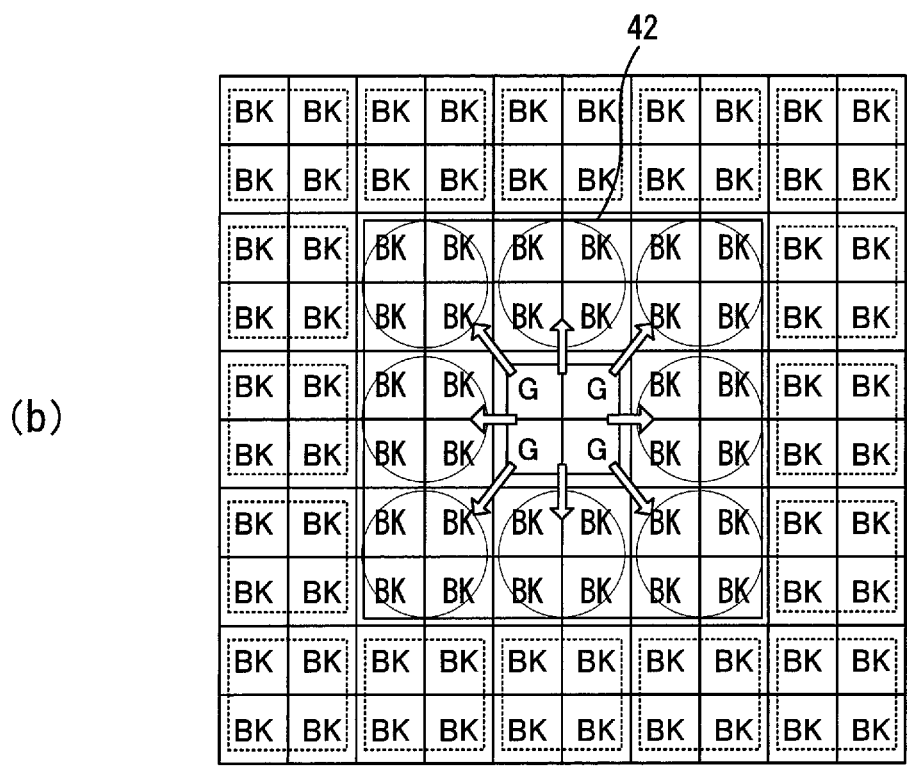

The Bayer array pattern is formed for an image-capturing operation in the embodiments by repeating a basic pattern unit of one R pixel, two G pixels and one B pixel. As an alternative, the control unit 4 may control the filter units 35 so as to form a Bayer array pattern by repeating a basic pattern unit made up of four R pixels, eight G pixels and four B pixels, as shown in FIG. 11(a). In this case, the control unit 4 will control the filter units 35 at the various pixels 10 as shown in FIG. 11(b) to obtain dark current component values and color mixing correction coefficients. The control unit 4 may calculate a dark current component value and a color mixing correction coefficient in correspondence to, for instance, 2×2 pixels=4 BK pixels 10. In conjunction with dark current component values and color mixing correction coefficients thus calculated, accurate correction processing can be executed on sum signals each generated by, for instance, adding together pixel signals generated at 2×2=4 pixels.

(Variation 4)

The control unit 4 may adjust the transmission wavelength range at the filter unit 35 in each pixel 10 in correspondence to the zoom magnification factor in the electronic zoom function of the camera 1. FIG. 12(a) shows an array pattern with which a pixel signal readout area 120A, R pixels, G pixels, B pixels and BK pixels may be set when the magnification factor achieved through the electronic zoom is relatively low. FIG. 12(b) shows an array pattern with which a pixel signal readout area 120B, R pixels, G pixels, B pixels and BK pixels may be set when the magnification factor achieved through the electronic zoom is relatively high. The image generation unit 4c in the control unit 4 will generate image data based upon the pixel signals output from the pixels 10 in the readout area 120 (120A or 120B). The pixels 10 present within the readout area 120 are effective pixels and the readout area 120 is an effective pixel area.

Figure 12:
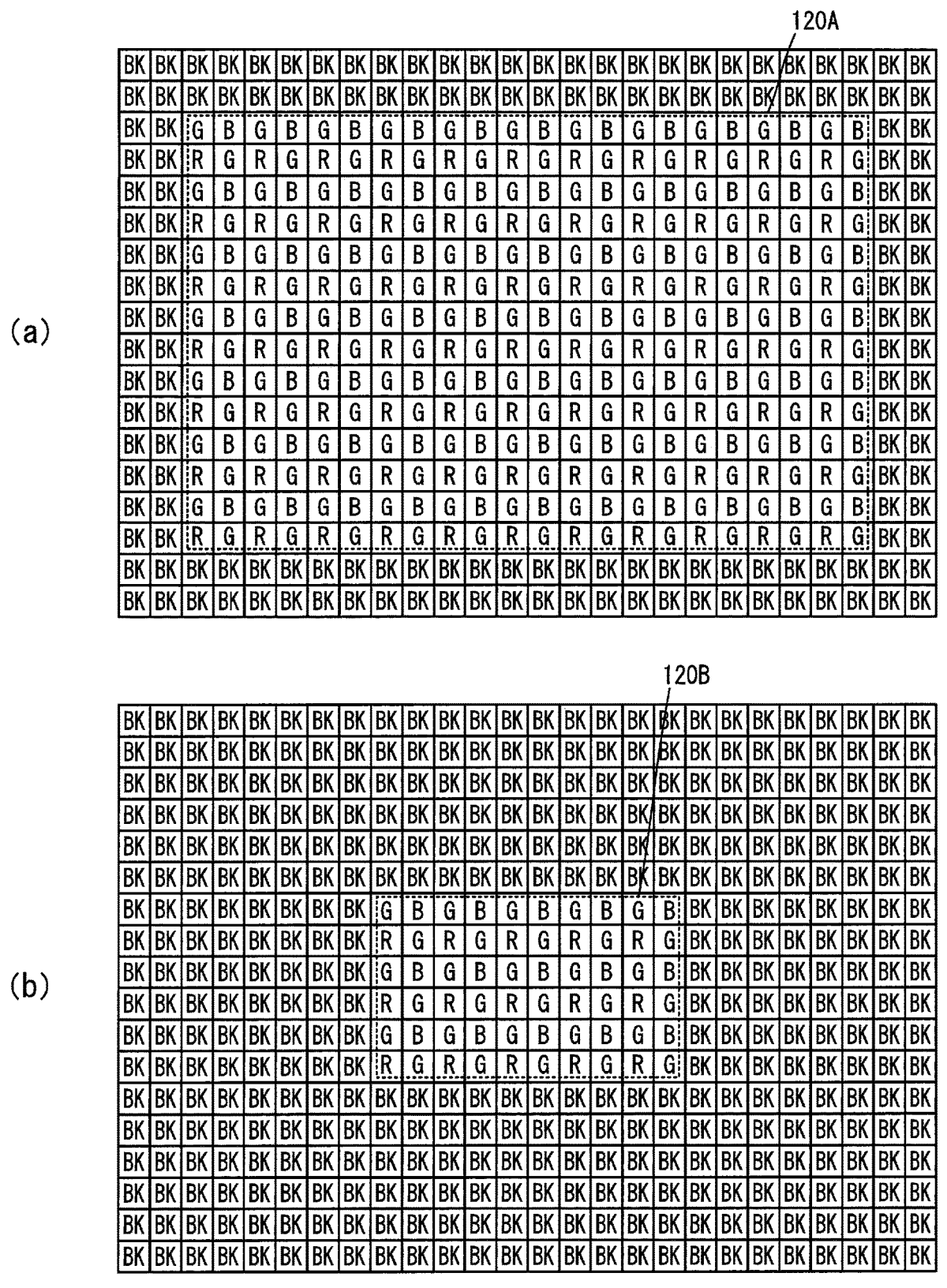

The control unit 4 will control the filter units 35 to switch pixels 10 outside the readout area so as to designate them as BK pixels 10, as shown in FIG. 12. Through these measures, it is ensured that photoelectric conversion operation is not executed in the BK pixels 10 present outside the readout area. As a result, noise attributable to photoelectric conversion operation executed in the pixels outside the readout area does not enter pixel signals at the pixels inside the readout area. This means that noise, attributable to electric charges in the photoelectric conversion units 32 at pixels outside the readout area, which become saturated and leak into the pixels inside the readout area, does not occur in an image generated by capturing an image of, for instance, a high luminance subject.

(Variation 5)

The filter units 35 in the embodiments and the variations thereof each include three filters constituted with an EC layer that produces R (red) color, an EC layer that produces G (green) color and an EC layer that produces B (blue) color. As an alternative, the filter units 35 may each include three filters constituted with an EC layer that produces Mg (magenta) color, an EC layer that produces Ye (yellow) color and an EC layer that produces Cy (cyan) color. In addition, the filter units 35 may be variable filters constituted with liquid crystal.

It is to be noted that the filter units 35 may be each constituted by combining a color filter that includes a filter through which light at a first wavelength is transmitted, a filter through which light at a second wavelength, greater than the first wavelength, is transmitted and a filter through which light at a third wavelength, greater than the second wavelength, is transmitted, with a filter that can be switched to a transmissive state in which light is transmitted or to a light-shielding state in which light is blocked. For instance, the filter units 35 may each be constituted by combining a color filter through which light assuming wavelength ranges different from one another is transmitted (an RGB color filter or an MgYeCy color filter) and a variable filter (a liquid crystal filter or an MEMS shutter) that can be adjusted to a transmissive state or to a light-shielding state. In addition, the filter units 35 may be each constituted by combining a variable color filter that allows a transmission light wavelength range to be adjusted, as explained earlier, and a variable filter that can be adjusted to either a transmissive state or to a light-shielding state.

(Variation 6)

In the embodiments and the variations thereof described above, the photoelectric conversion units are each constituted with a photodiode. As an alternative, photoelectric conversion units each constituted with a photoelectric conversion film (organic photoelectric film) may be used.

(Variation 7)

The image sensor 3 having been described in reference to the embodiments and the variations thereof may be adopted in a camera, a smart phone, a tablet, a built-in camera in a PC, an on-vehicle camera, a camera installed in an unmanned aircraft (such as a drone or a radio-controlled airplane) and the like.

While the embodiment and variations thereof have been described, the present invention is not limited to the particulars of the examples. Any other mode conceivable within the scope of the technical teaching of the present invention is within the scope of the present invention.

The disclosure of the following priority application is herein incorporated by reference:

Japanese Patent Application No. 2016-194627 filed Sep. 30, 2016

REFERENCE SIGNS LIST 3 image sensor, 10 pixel, 20 readout unit, 32 photoelectric conversion unit, 35 filter unit, 4a correction unit

The invention claimed is:

1. An image-capturing device comprising:
a first filter having a light transmissive state that is adjustable between a first state and a second state;
a second filter having a light transmissive state that is adjustable between the first state and the second state;
a first photoelectric conversion unit that converts light transmitted through the first filter into an electric charge;
a second photoelectric conversion unit that converts light transmitted through the second filter into an electric charge; and
a correction unit that, based upon a signal generated from the electric charge converted by the first photoelectric conversion unit during a period in which the first filter is in the first state and the second filter is in the second state, corrects a signal generated from the electric charge converted by the first photoelectric conversion unit during a period in which the first filter is in the second state, wherein:
the first state has a lower light transmittance than the second state.

2. The image-capturing device according to claim 1, further comprising:
a first pixel having the first photoelectric conversion unit; and
a second pixel having the second photoelectric conversion unit; wherein:
the first pixel and the second pixel are disposed adjacent to each other.

3. The image-capturing device according to claim 2, wherein:
a plurality of the first pixels are disposed so as to surround the second pixel.

4. The image-capturing device according to claim 1, further comprising:
a control unit that controls the first filter and the second filter to be in one of the first state and the second state, respectively.

5. The image-capturing device according to claim 4, wherein:
the control unit controls at least one of an area and a position of the filter first and second filters which are in the first state or the second state.

6. The image-capturing device according to claim 1, wherein:
the first filter and the second filter are capable of changing a wavelength of light to be transmitted therethrough.

7. The image-capturing device according to claim 6, wherein:
the first filter and the second filter are capable of changing between a first transmissive state in which light at a first wavelength is transmitted, a second transmissive state in which light at a second wavelength is transmitted and a third transmissive state in which light at a third wavelength is transmitted.

8. The image-capturing device according to claim 1, wherein:
based upon the signal generated from the electric charge converted by the first photoelectric conversion unit during the period in which the first filter is in the first state and the second filter is in the second state, the correction unit corrects the signal generated from the electric charge converted by the first photoelectric conversion unit during the period in which the first filter is in the second state and the second filter is in the second state.

9. The image-capturing device according to claim 1, wherein:
the correction unit eliminates, from the signal generated from the electric charge converted by the first photoelectric conversion unit during the period in which the first filter is in the second state, a signal component generated from the electric charge converted by the first photoelectric conversion unit during the period in which the first filter is in the first state and the second filter is in the second state.

10. The image-capturing device according to claim 1, wherein:
based upon a signal generated from the electric charge converted by the first photoelectric conversion unit during a period in which the first filter is in the first state, the correction unit corrects a signal generated from the electric charge converted by the second photoelectric conversion unit during a period in which the second filter is in the second state.

11. The image-capturing device according to claim 10, wherein:
based upon the signal generated from the electric charge converted by the first photoelectric conversion unit during the period in which the first filter is in the first state, the correction unit corrects a signal generated from the electric charge converted by the second photoelectric conversion unit during a period in which the first filter is in the second state and the second filter is in the second state.

12. The image-capturing device according to claim 10, wherein:
the correction unit eliminates, from the signal generated from the electric charge converted by the second photoelectric conversion unit during the period in which the second filter is in the second state, a signal component generated from the electric charge converted by the first photoelectric conversion unit during the period in which the first filter is in the first state.

* * * * *